US008878519B2

(12) United States Patent
Dvorak et al.

(10) Patent No.: US 8,878,519 B2

(45) Date of Patent: Nov. 4, 2014

(54) DIFFERENTIAL TARGET ANTENNA COUPLING (DTAC)

(75) Inventors: Steven L. Dvorak, Tucson, AZ (US); Ben K. Sternberg, Tucson, AZ (US)

(73) Assignee: Arizona Board of Regents on behalf of the University of Arizona, Tucson, AZ (US)

( * ) Notice: Subject to any disclaimer, the term of this patent is extended or adjusted under 35 U.S.C. 154(b) by 769 days.

(21) Appl. No.: 12/912,511

(22) Filed: Oct. 26, 2010

(65) Prior Publication Data

US 2011/0095748 A1 Apr. 28, 2011

Related U.S. Application Data

(60) Provisional application No. 61/279,834, filed on Oct. 26, 2009, provisional application No. 61/279,830, filed on Oct. 26, 2009.

(51) Int. Cl.
*G01R 23/02* (2006.01)
*G01V 3/10* (2006.01)

(52) U.S. Cl.
CPC ................ *G01V 3/104* (2013.01); *G01R 23/02* (2013.01)
USPC ........................................................ 324/76.39

(58) Field of Classification Search
None
See application file for complete search history.

(56) References Cited

U.S. PATENT DOCUMENTS

| | | | |
|---|---|---|---|
| 5,781,436 A | 7/1998 | Forgang et al. | |
| 7,330,399 B2 * | 2/2008 | Lerro et al. | 367/99 |
| 7,532,856 B2 * | 5/2009 | Stoddard et al. | 455/1 |
| 8,253,560 B2 * | 8/2012 | Howard et al. | 340/539.32 |
| 2005/0199731 A9 * | 9/2005 | Empedocles et al. | 340/572.7 |
| 2006/0033659 A1 * | 2/2006 | Strickland | 342/372 |
| 2008/0002526 A1 * | 1/2008 | Kirschner et al. | 367/87 |

* cited by examiner

*Primary Examiner* — Jermele M Hollington
(74) *Attorney, Agent, or Firm* — Klarquist Sparkman, LLP

(57) ABSTRACT

Sub-surface detection systems include a transmitter antenna and a receiver antenna that is coupled to a receiver circuit. The receiver antenna is rotated to three different orientations, and a reference null field direction is determined. Based on variations in the null field direction at other frequencies or variations in a magnitude of a field component in the reference null field direction, the presence, location, depth, size, and electrical properties of a target can be determined.

25 Claims, 17 Drawing Sheets

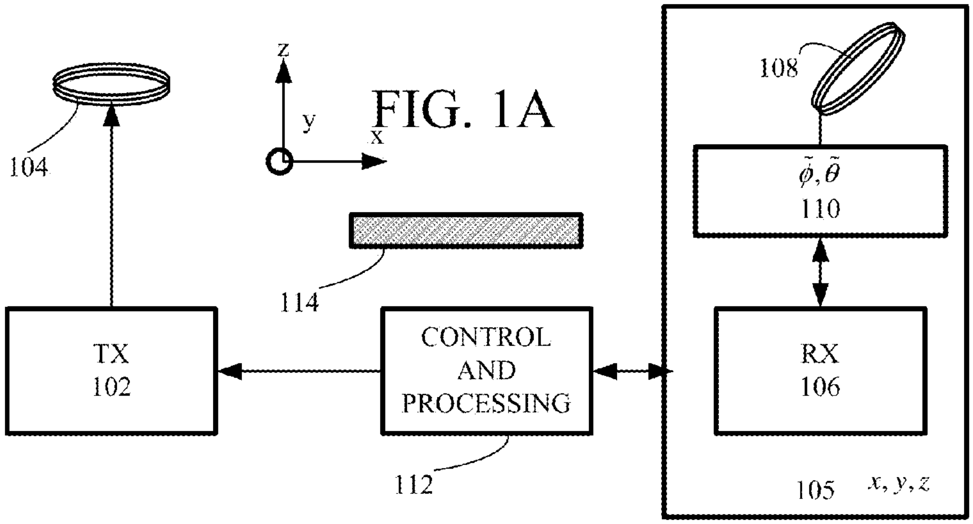
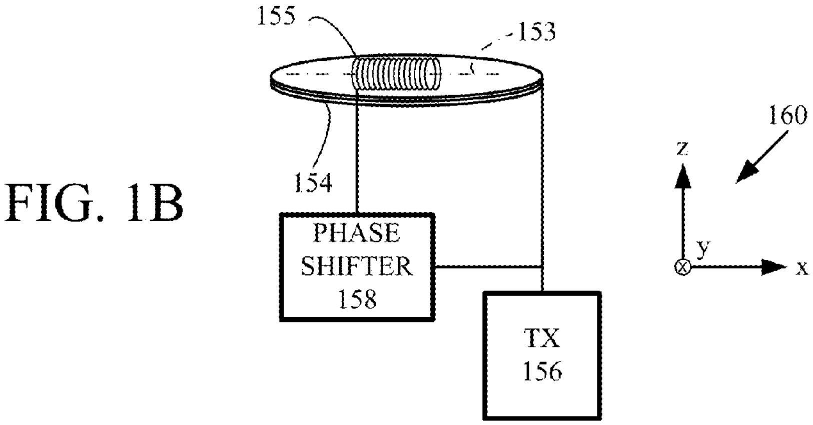
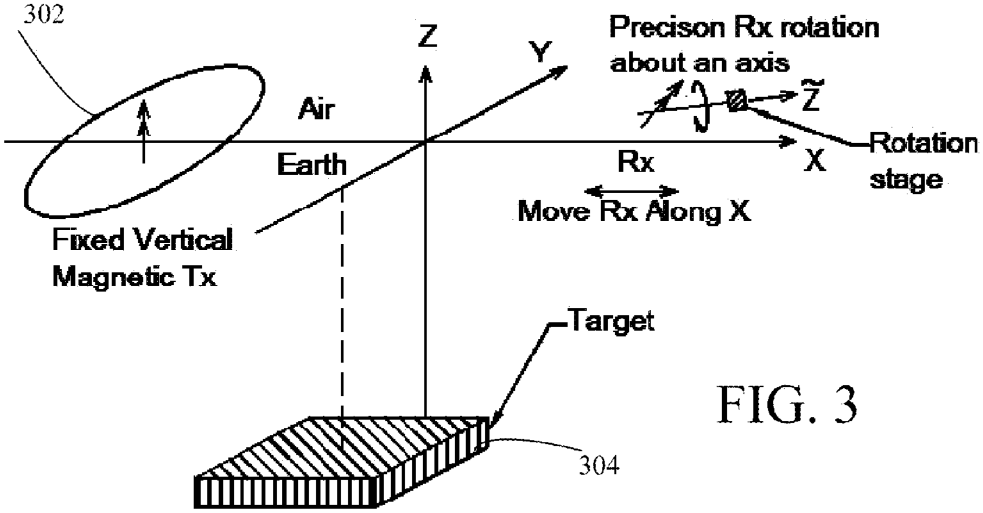
FIG. 3

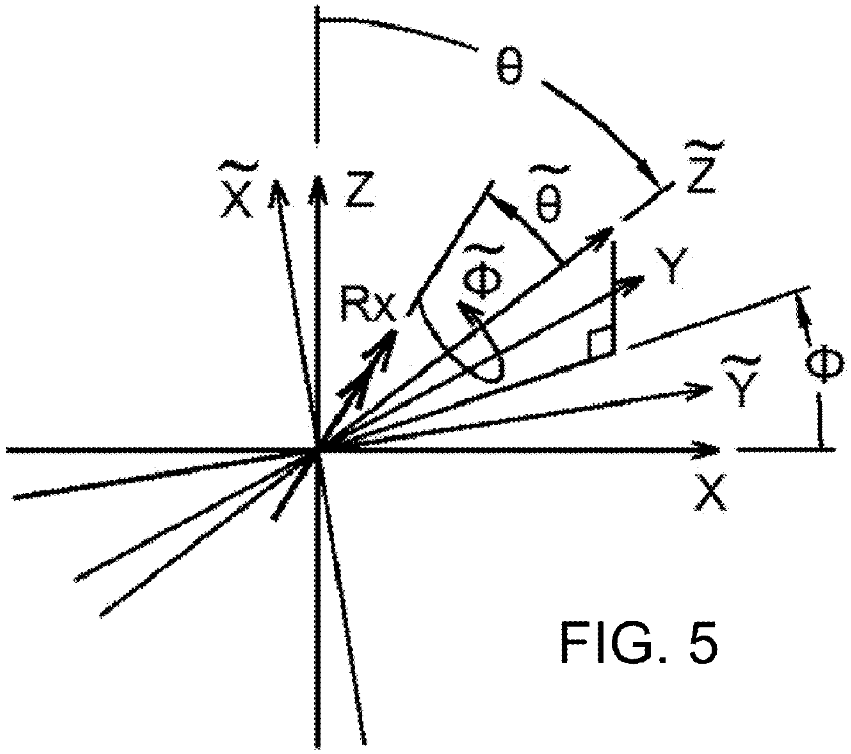
FIG. 5
FIG. 6A
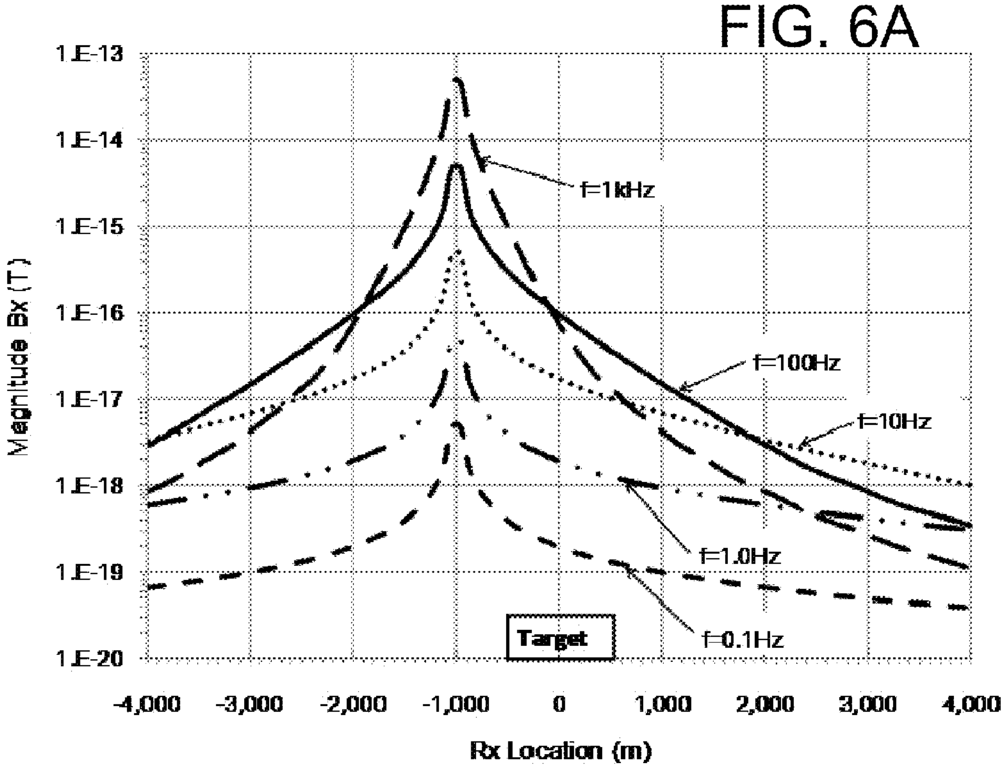

1100

FIG. 19
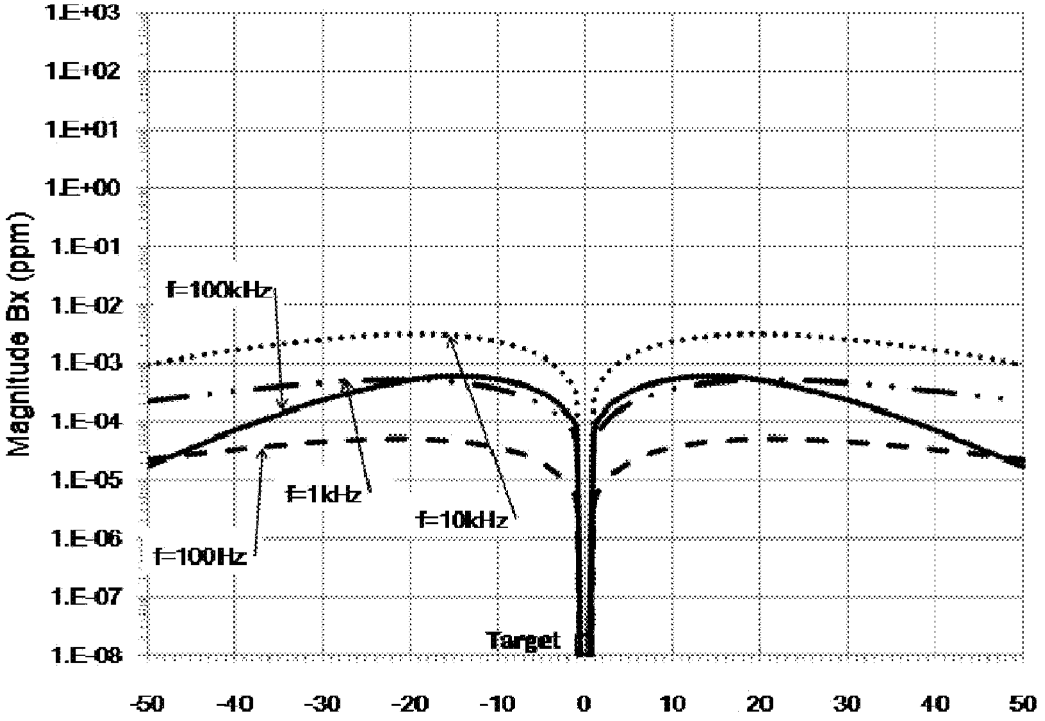
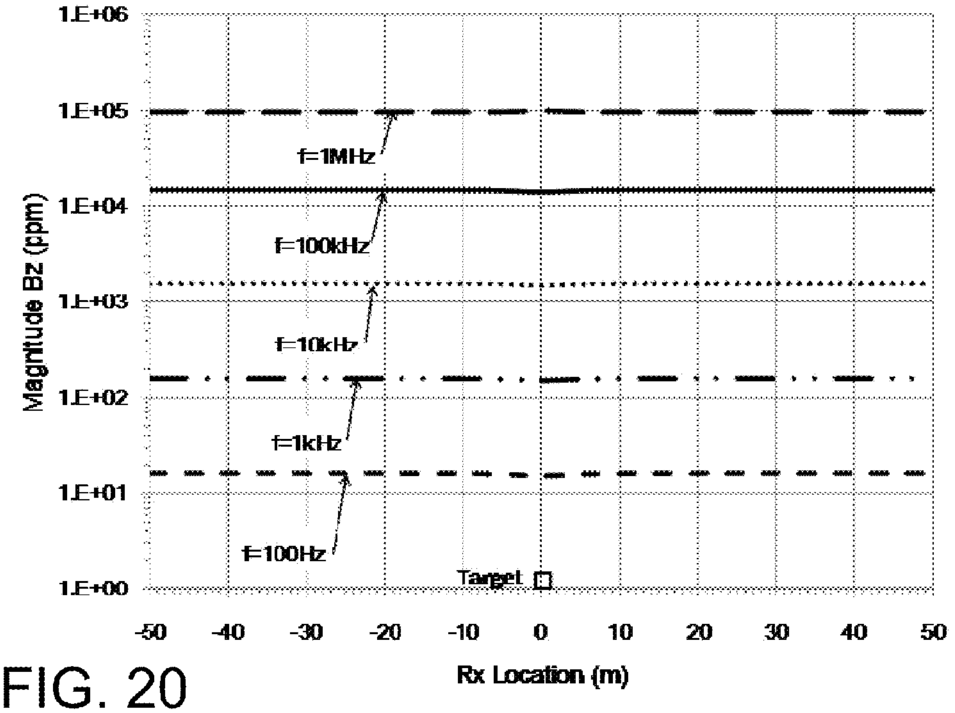
FIG. 20

DIFFERENTIAL TARGET ANTENNA COUPLING (DTAC)

CROSS REFERENCE TO RELATED APPLICATION

This application claims the benefit of U.S. Provisional Application No. 61/279,834, filed Oct. 26, 2009, and U.S. Provisional Application No. 61/279,830, filed Oct. 26, 2009, both of which are incorporated herein by reference.

FIELD

The disclosure pertains to detection and imaging of sub-surface targets.

BACKGROUND

Sub-surface target detection systems may be based on frequency domain measurements. One significant advantage of such Frequency-Domain Electromagnetic (FEM) systems over Time-Domain Electromagnetic (TEM) systems is that with FEM systems it is possible to achieve a larger dynamic range in the presence of noise because of the narrow-band filtering in such systems. Since the operational bandwidth can be controlled, FEM systems can use much higher transmitter (TX) power without violating FCC regulations when operated at low frequencies below 9 kHz and at higher frequencies within the Industrial, Scientific and Medical (ISM) bands. Another advantage of the frequency domain is that FEM systems measure both in-phase and quadrature-phase components of the data, both of which can contribute to target characterization. TEM methods typically measure only during 'off-times' (i.e., when the primary field is turned off). This is equivalent to measuring only the quadrature-phase data and the important in-phase data are lost. FEM measurements can be made at multiple frequencies and over a very broad bandwidth, which also allows for a more detailed target characterization.

A major limitation of the FEM technique has been that measurements are made in the presence of the very strong primary field. Overcoming this problem presents the greatest challenge in achieving high performance in FEM systems. The amount of reduction in the primary field at the location of the receiver (RX) antenna directly contributes to an increase in dynamic range of the FEM system.

One common approach to reducing the primary field at the RX antenna is to orient the TX and RX coils orthogonal to each other (typically referred to as "geometric nulling"). A second common approach is to use a nulling signal from a third coil (typically referred to as "electrical nulling"). The long-term stability of the geometric or electric null is important for system performance. Because the primary field is large, small variations in the geometric alignment of the TX and RX antennas, and any nulling coils can cause a substantial change in the level of signal measured at the RX antenna. Any change in signal level due to geometric misalignment or error in an electrical nulling signal can mask actual target related signals. Therefore, the sensitivity and the measurement accuracy of state-of-the-art FEM systems are largely dependent on the degree of stability of the null over long periods of time, which is commonly characterized by the long-term drift of the system. The presence of the large primary field is especially challenging when trying to map deeply buried resistive bodies, since resistive bodies typically exhibit much smaller secondary fields than conductive bodies.

Techniques which permit the removal (i.e., nulling) of the large primary field as well as the secondary field from a layered earth and greatly reducing the temporal drift that is exhibited in commercially-available FEM systems have been described in Sternberg et al., "A New High-Sensitivity Subsurface Electromagnetic Sensing System Part I—System Design," *Journal of Environmental & Engineering Geophysics* 13:247-261 (2008), and Krichenko et al., "A New High-Sensitivity Subsurface Electromagnetic Sensing System Part II—Measurement Results," *Journal of Environmental & Engineering Geophysics* 13:263-275 (2008) all of which are incorporated herein by reference. These techniques can provide enhanced capabilities for the mapping of buried targets. The effects of drift can be compensated with an antenna array rotation referred to generally as an Alternating Target Antenna Coupling (ATAC) method. In such systems a TX antenna and an RX antenna are fixed with respect to each other in a null configuration to form a null coupled array. The null coupled array can have a vertical or horizontal orientation with respect to the earth's surface, and a series of relative measurements at different rotational positions of the array can be used to compensate instrument drift and significantly improve long-term measurement stability and accuracy. An electrical rotation is possible, but electrical rotation-based techniques are generally less sensitive and provide a much lower dynamic range than can be achieved with mechanical rotation over short time intervals.

One of the advantages of such ATAC methods is that measurements can be made in any direction about an array rotation axis. Data obtained from multi-directional measurements can be used to determine the location of a target in three-dimensional (3-D) space, as well as to discriminate between multiple targets. The close spacing between the TX and RX antennas make ATAC techniques particularly applicable to shallow targets such as unexploded ordnance (UXO) and utility lines.

Successful mapping of deeper targets requires a large separation between the TX and RX antennas or a large diameter TX antenna. In some applications, TX/RX antenna dimensions of a few kilometers may be required to map targets at corresponding depths. At large separations, a much larger transmitter moment must also be used to obtain an adequate signal-to-noise ratio, and ATAC systems are impractical due to practical difficulties in securing a large TX antenna with a large antenna moment and a widely-spaced RX antenna to a rigid, rotatable axis to form a nulled array. For at least these reasons, new approaches are needed, particularly for the measurement of deep objects.

SUMMARY

Representative methods disclosed herein comprise receiving a transmitted electromagnetic field at a receiver antenna and recording values associated with the field received at the receiver antenna for a plurality of receiver antenna orientations and a plurality of received frequencies. A null direction is determined at a reference frequency selected from the plurality of frequencies. Based on a magnitude of a field component in the null direction or a variation of the null direction at one or more of the plurality of frequencies, a target presence is indicated. In additional examples, the plurality of receiver antenna orientations includes at least three orientations, and the recorded values associated with the received field are obtained with a common receiver coupled to at least one receiver antenna. In some examples, a single receiver antenna and a single receiver are used. In some examples, the receiver antenna is rotated to establish the plurality of orientations or the plurality of orientations is based on associated receiver antennas. In additional examples, the target presence is established based on a variation in a null direction at one or more frequencies with respect to the null field direction at the reference frequency. In further embodiments, an estimate of a target location is provided based on a change in null direction at one or more frequencies based on a plurality of receiver antenna and transmitter antenna separations.

Other methods include receiving null directions associated with a plurality of frequencies and based on variation in the received null directions, indicating a presence of a target. In some examples, field components as detected by a receiver antenna are received, and based on the received field components, null directions associated with the plurality of frequencies are determined. In other embodiments, field measurements associated with at least three receiver antenna orientations are received, and the received field components are determined based on the field measurements.

In other examples, methods include receiving a reference null direction associated with a reference frequency. Based on magnitudes or phases of a field detected by a receiver antenna at a plurality of frequencies in a direction associated with the reference null direction, presence of a target is indicated. In further examples, field values detected at a receiver antenna and associated with at least three receiver antenna orientations are provided, and magnitudes or phases of the detected fields are estimated based on the detected field values. In some examples, at least one computer readable storage device comprises computer-executable instructions for such methods.

Apparatus comprise at least one receiver antenna configured to detect a transmitted field at a plurality of frequencies and received at a receiver antenna location at a plurality of angular orientations with respect to a transmitted field. A processing system is configured to determine a field null direction based on the detected field, and, based on the null direction, indicate whether a target is likely to be present. In some examples, a rotational stage is coupled to the receiver antenna and configured to establish the plurality of receiver antenna orientations. In further representative examples, the receiver antenna and a transmitter antenna are retained at a fixed separation. In other examples, a separation between the receiver antenna and a transmitter antenna is variable. In still additional examples, the processing system is configured to estimate field components in the null direction for the plurality of frequencies, and provide an indication of target presence based on the estimates. In other alternatives, the processing system is configured to estimate null directions for the plurality of frequencies, and provide an indication of target presence based on the estimated null directions. In additional embodiments, a transmitter is configured to transmit a first field and a second field that is out of phase with the first field and such that the first field and the second field are not aligned at the receiver antenna. The reference null direction is determined by the processing system based on the first field and the second field. In additional examples, the processing system is further configured to determine an ellipticity of the field detected by the receiver antenna, and based on a magnitude of the determined ellipticity, indicate that a target is not present.

Data obtained with differential antenna-target coupling (DTAC) methods and apparatus can be inverted to a model (or image) of a subsurface using standard electromagnetic modeling programs, such as EMIGMA, available from http://www.petroseikon.com/emigma/. A starting model of a target or targets is assumed, then the modeling program is used to calculate theoretical DTAC parameters (angles, magnitudes, and phases relative to a reference null), and these theoretical DTAC parameters are compared with the measured DTAC parameters. The subsurface target model is then adjusted until the measured DTAC parameters and the calculated DTAC parameters match or approximately match at some or all measured frequencies and xyz locations. Typically, such matching can be conveniently performed based on a minimization of a sum of squares of differences between measured and calculated DTAC values. The adjusted model then provides an image of the subsurface target or targets.

The foregoing and other objects, features, and advantages of the disclosed technology will become more apparent from the following detailed description, which proceeds with reference to the accompanying drawings.

BRIEF DESCRIPTION OF THE DRAWINGS

FIG. 1A is a block diagram illustrating a representative system for detecting a target object that includes a single transmitting antenna.

FIG. 1B is a block diagram illustrating a representative system for detecting a target object that includes first and second antennas configured to be driven out of phase by a transmitter.

FIG. 3 illustrates coordinate systems that are convenient for determining antenna orientation and implementation of procedures for estimating null orientations.

FIG. 5 illustrates RX antenna orientations, a rotated beam coordinate system ($\tilde{x},\tilde{y},\tilde{z}$), and a global coordinate system (x,y,z) for use in back-calculation of received field components.

FIGS. 6A-6C are graphs of computed magnitudes of components of magnetic flux density as a function of RX antenna location for a highly resistive target (ρ=1000 Ωm and $\in_r$=10) located in a resistive earth (ρ=100 Ωm and $\in_r$=10) based on a transmitter having a moment of 1 $Am^2$ and located at x=−1000 m with a 1 km by 1 km by 100 m target located at x=0 m, y=−500 m, and z=−500 m. Typical transmitter moments as implemented would be much larger than 1 $Am^2$, but transmitter moment can be scaled to any value.

FIGS. 17-19 are graphs of a magnitude of an x-component of magnetic flux density as a function of RX antenna location for a target that is a void ($\rho$=1E8 $\Omega$m and $\in_r$=1) located in a resistive earth ($\rho$=25 $\Omega$m and $\in_r$=10) at depths of 3 m, 10 m, and 30 m, respectively. The TX and RX antennas are separated by 3 m in a y-direction as shown in FIG. 16 and are moved together along the x-axis.

FIG. 20 is a graph of a z-component of magnetic flux density as a function of RX antenna location for the void target and RX/TX configuration of FIGS. 17-19.

DETAILED DESCRIPTION

Figure 2:
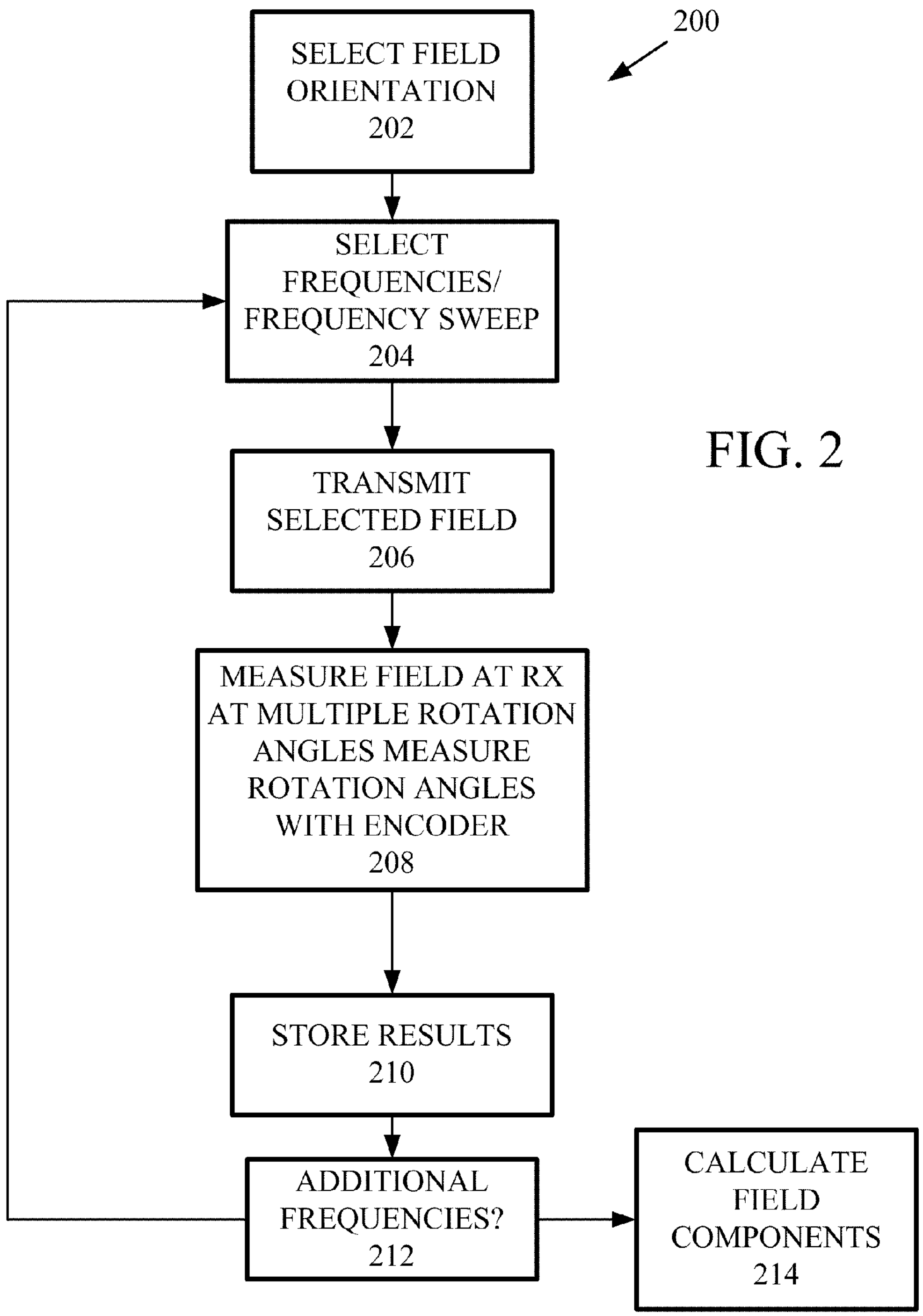
FIG. 2 illustrates a representative method for determining received field components based on data acquired by a system such as that of FIG. 1A.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce," "provide," and "determine" to describe the disclosed methods. These terms are high-level abstractions of the actual operations that are performed. The actual operations that correspond to these terms will vary depending on the particular implementation and are readily discernible by one of ordinary skill in the art.

In the following, certain parameters are referred to as determined, calculated, estimated, or otherwise obtained. It will be appreciated that any such parameters based on measure values can be referred to as estimates. In addition, electromagnetic fields are described as being received at RX antennas. An RX antenna/receiver circuit can be configured to produce a detected signal associated with the actual received vector field. As used herein, a receiver circuit serves to produce an electrical signal such as a voltage or current whose magnitude and/or phase are indication of detected field magnitude, phase, or both. A receiver circuit can be implemented in one or more stages, and can include one or more analog-to-digital convertors to produce a digital indication of detected field characteristics.

OVERVIEW

As disclosed herein, differential antenna-target coupling (DTAC) methods and apparatus permit removal or compensation of a primary response and a secondary response to a transmitted interrogating field in measurements on a layered earth. Measurements based on a common receiver and three or more RX antenna orientations permit the effects of receiver drift and receiver gain errors to be compensated or eliminated as such errors tend to be the same for each RX antenna orientation. In addition, although the DTAC methods require precise measurement of the relative angles $\tilde{\phi}$ and $\tilde{\theta}$ that characterize RX antenna orientation, these methods do not require precise orientation of measurement system components (such as TX and RX antennas), and a back-calculated null direction can be used. In some examples, a back-calculated reference null can be obtained at a reference frequency, and variations in null direction at other frequencies can be associated with a target. Alternatively, a magnitude and phase of a detected field can be calculated at one or more frequencies for a field component parallel to the reference frequency null direction. Absent a target, this field component is very small, and appreciable values of a magnitude of this field component indicate a target. Back-calculations of fields and null direction calculations can be performed with respect to a global coordinate system or in a rotated beam coordinate system associated with RX antenna rotation. In some examples, a TX antenna is fixed, and an RX antenna is moved to conduct a site survey, or a TX/RX antenna array with a fixed RX/TX antenna separation can be moved.

In most examples, the wave tilt that results from a vertically oriented magnetic field propagating a horizontal distance over the earth's surface creates a polarization ellipse which can provide an orientation reference and leads to unique angles for null vectors. For small TX/RX antenna separations and low transmitter frequencies, there can be inadequate wave tilt (i.e., an insufficiently large horizontal field component) to establish a null direction. For such small horizontal propagation distances or low transmitter frequencies, one method to overcome this problem is to use a second out-of-phase transmitter to create a polarization ellipse to establish an unambiguous null direction. A second method to overcome this problem involves the following. Situations in which a null orientation cannot be defined are recognized and reported. Thus, for large transmitter-receiver separations or for high transmitter frequencies, there is an elliptical plane (with an orthogonal null direction), and the disclosed methods can find consistent data with or without a target present. For near transmitter-receiver separation or for low transmitter frequencies, there may not be a well defined elliptical plane (with an orthogonal null direction) in the absence of a target. The disclosed methods can then record no data and indicate that no target is present, but can correctly record the target response as the presence of a target establishes a suitable elliptical plane. For convenience in the following description, the low wave tilt situations are not described further.

Disclosed herein are representative methods and apparatus that can be practically implemented even for large TX antennas and at large TX/RX antenna separations. In some examples, the methods and apparatus are generally based on a fixed antenna (such as a fixed loop antenna) arranged with respect to a surface of the earth so as to provide a transmitted electromagnetic field having a substantially vertical magnetic field. Other arrangements of magnetic field can be used, and methods and apparatus can be arranged to use transmitted magnetic field, transmitted electric field or combinations of such fields in one or more selected orientations. For convenience examples based on vertically directed magnetic fields are described in some representative examples. In addition, in some examples a loop antenna is used, but other antenna configurations can be used as well. In some examples, measurements are made with a single antenna in two, three or more orientations. Measurements in four or more antenna orientations can provide additional accuracy in back-calculation of fields. In some embodiments, the antenna is coupled to a single receiver (RX) circuit, but in other examples two, three, or more antennas are provided in corresponding orientations. Such multiple antennas can be selectively or otherwise coupled to a single RX circuit for field detection. As discussed below, use of a single RX circuit and RX antenna permits elimination or reduction of drift that can otherwise obscure weak detected fields.

The disclosed examples are described with reference to coordinate systems with respect to the earth such that a z-axis is vertical, transmitter and receiver antennas are separated along an x-axis, and a y-axis is orthogonal to both the x-axis and the z-axis. Using such coordinate axes, a series of measurements of received field can be made varying the transmitter-receiver antenna separation. For example, the transmitter and receiver antenna separation can be increased so that a target object that is initially not between the transmitter and receiver antennas is situated between the antennas. When so situated, the target can produce contributions to the received field based on amplitude, phase, direction, or other characteristics or changes in the received field. As a result, the target is determined to be present and an approximate location can be established based on transmitter/receiver antenna locations at which target signal contributions appear. Transmitter/receiver antenna separation can be varied by translating one or both of the transmitter and receiver antennas along an x, y, or z-axis. For detection of buried objects, separation along the x-axis or the y-axis is generally varied.

A series of measurements configured to interrogate a region is referred to herein as a "survey." In one example, a survey comprises measurements at a plurality of RX/TX antenna separations, and such a survey is referred to herein as a "a variable antenna separation based survey." In other examples, TX/RX antennas are maintained at a fixed separation, and a survey is conducted by moving both antennas while maintaining the fixed separation. During such a survey, target objects can be located based on received field contributions as the combined antennas are translated so that the target is situated between the antennas. A series of measurements with a fixed transmitter/receiver antenna separation but at varying locations with respect to a region in which targets are to be detected is also referred to herein as a "fixed antenna separation based survey." In another type of survey, both TX and RX antenna locations are fixed with the RX antenna located at the center of the TX antenna), and the TX antenna radius varied to obtain a series of measurements. Such a survey is referred to as an "antenna area based survey." Increasing TX antenna radius generally increases field penetration depth. Surveys can also be based on combinations of such approaches.

An axis along which one or more antennas are moved in acquiring survey data can be referred to as a "profile line." In some examples, a fixed transmitter/receiver antenna array is moved to a plurality of locations such as an array of locations. In other examples, one or both of the transmitter and receiver antennas are moved to a plurality of locations such as an array of locations.

Typical examples of surveys include movement of just the RX antenna through a rectangular grid of location. Alternatively, the TX/RX antenna separation can be fixed, and the RX antenna moved to different angular locations in a circle having the TX antenna at the center of the circle. In other examples, the TX antenna can be moved in a circle about a fixed RX antenna. In other examples, either the RX antenna or the TX antenna is fixed, and the other lowered into a borehole into the earth. Finally, the TX and RX could be held constant in position (with the RX loop located at the center of the TX loop), but the TX loop radius may be made larger between the measurement in order to increase the depth of penetration of the fields into the earth with the TX/RX loop separation remaining constant.

REPRESENTATIVE EXAMPLES

With reference to FIG. 1A, representative systems include a transmitter 102 coupled to a transmitter (TX) antenna 104 and a receiver 106 coupled to a receive (RX) antenna 108. In FIG. 1, both antennas 104, 108 are shown as coils, but other antenna configurations can be used. The RX antenna 108 is secured to a rotation stage 110 that is controlled by a system controller 112, and the receiver 106, the RX antenna, and the rotation stage 110 are secured to a receiver frame 105 that is translatable in any of an x-direction, a y-direction, and/or a z-direction. The system controller 112 is coupled to the frame 105 so as to translate the RX antenna to conduct a site survey. The system controller 112 is configured to establish one or more orientations of the RX antenna 108 with respect to the TX antenna 104, to control the transmitter 102, and to process received signals from the RX antenna 108. The TX antenna 104 can also be secured to a rotation stage (not shown in FIG. 1), but it is generally more convenient to control the orientation of the RX antenna 108 as the RX antenna 108 is generally smaller and less massive. A TX antenna rotational stage would permit transmit/receive orientation to be adjusted by the controller 112 with respect to a target 114 without requiring an operator at either antenna. In addition, the TX antenna and transmitter can be secured to a translatable frame such as the frame 105, but as noted above, it is generally more convenient to translate the RX antenna 108 and the receiver 106. Typically, the RX antenna 108 is secured to the rotational stage 110 so as to be tilted with respect to a stage axis of rotation, and the controller 112 is configured to establish three or more predetermined angular orientations of the RX antenna 108. Alternatively, three different RX antennas can be provided, and selectively coupled to the receiver 106. The RX antenna 108 is also generally coupled to the rotation stage 110 so as to be movable along any of an x, y, or z-axis as shown in FIG. 1A.

The transmitter 102 and TX antenna 104 are configured to operate at multiple frequencies, and electrical signals associated with corresponding received field components at the RX antenna 108 (typically, magnetic field components) are communicated to the controller 112 for processing. Based on signals detected with multiple angles of rotation of the RX antenna 108 (or separately oriented RX antennas), three orthogonal components of the field received at the RX antenna 108 can be determined at multiple transmitter frequencies. Based on these "back calculated" field components, a null direction for total field can be calculated at a frequency selected as a reference frequency. In typical examples, the transmitted field is associated with a series of single transmitted frequencies, or a frequency sweep, and the receiver is configured to detect amplitude and phase at a plurality of transmitter frequencies. In other examples, a chirped pulse (or other pulse having a suitable spectrum) is repetitively transmitted and detected, and the detected signal is Fourier transformed to produce amplitudes and phases at a plurality of frequencies.

In some situations, typically associated with low frequency operation or small TX/RX antenna separations, an additional TX antenna is used. Referring to FIG. 1B, a first TX antenna 154 such as a loop antenna is situated in plane parallel to an xy-plane with reference to coordinate axes 160. A second antenna 155 can be a rod antenna that includes a coil that extends along an axis 153 that is parallel to an x-axis. A transmitter 156 is configured to energize the first TX antenna 154 and the second TX antenna 155 with a phase shifter 158 configured to provide a phase shift between the drive signals applied to first antenna 154 and the second antenna 155. Alternatively, the first TX antenna 154 and the second TX antenna 155 can be coupled directly to respective digital-to-analog convertors (DACs) configured to provide suitable drive signals. As shown in FIG. 1B, the first antenna 154 provides a z-directed field component at an RX antenna and the second antenna provides an x-directed field component at the RX antenna that is out of phase with the z-directed field component. Thus, these field components define an elliptical polarization and not a linear polarization so that a polarization ellipse is well defined.

A representative method 200 of operating a system such as that of FIG. 1A is illustrated in FIG. 2. At 202, a field orientation for a particular field component to be transmitted is selected. For interrogation of subsurface targets in the earth, a vertical magnetic field component is convenient, but other orientations can be selected, and a magnetic field component, electric field component, or combination thereof can be selected. At 204, a frequency is selected, and at 206, a transmitter energizes a TX antenna to provide the selected field component at the selected frequency. In some examples, a frequency sweep is selected. A corresponding received field is detected by an RX antenna at a plurality of RX antenna orientations and the associated antenna rotation angles are measured with an encoder at 208, and corresponding signals are stored at 210. A determination is made at 212 concerning whether fields at additional frequencies are to be transmitted. If so, control returns to 204. If no additional frequencies are requested, field transmission and reception terminates, and the stored signals are used to determine one or more directional field components of the field received at the RX antenna at the selected frequencies (or a as a function of frequency sweep) at 214. In typical examples, components are determined with respect to an orthogonal xyz coordinate system in which a z-direction is vertical, an x-direction is parallel to an axis extending between RX and TX antennas, and a y-axis is perpendicular to the x-axis and the z-axis. In some examples, a single vector component of the field is calculated (generally the y-directed component in the described coordinate system) or a null direction, both of which can be estimated at one or more frequencies. After x, y, and z, components of the received magnetic field at each frequency have been estimated by back-calculation, these components can be processed for target detection. Determining a null direction for total field response permits target detection without knowledge of a precise orientation of TX/RX antennas.

As shown in FIG. 2, field measurements are made at a single frequency for multiple RX antenna orientations, and such measurements are repeated for additional frequencies. In other examples, an RX antenna orientation is established, and measurements are made at some or all frequencies of interest. The RX antenna is then rotated, and additional measurements are made at some or all frequencies of interest.

In one representative method of target detection, a null direction is established at a reference frequency. Based on the magnetic field calculated at other transmitted frequencies, a null direction as a function of frequency with respect to the reference null direction can be obtained. If the null field direction changes with frequency, a target is determined to be present. If there is no target present, then the null direction will be the same for all frequencies since $H_y$=0 for all frequencies. On the other hand, if a target is present, then the null orientation will change with frequency, and the RX antenna will receive the weak secondary field response associated with the buried target. Alternatively, if measured fields in the reference null direction are detected at other frequencies, target presence and location can be determined.

Antenna orientation control, signal processing, and representative procedures for estimating null orientation are described with reference to FIG. 3. A coordinate system includes an x-axis, a y-axis, and a z-axis. A TX coil 302 is situated to produce a substantially vertical (z-axis directed) magnetic field component with respect to a target 304 having a surface situated in a horizontal (xy) plane. (This configuration is typical of applications in which vertical transmitted fields can be used for measurements with respect to a horizontal surface of the earth.) For convenient description and calculation, the TX coil 302 is situated at coordinate (0,0,h) over a layered earth. As shown in J. R. Wait, *Geo-Electromagnetism* (Academic Press, 1982), x, y, and z-directed magnetic field components for a vertically oriented initially transmitted magnetic field can be expressed as a superposition $H^{PE}$ of a primary field $H^P$ and a secondary layered-earth response $H^E$, wherein $H^{PE}=H^P+H^E$ Primary field components associated with free space transmission of the transmitted field can be expressed as:

$$H_x^P=3Cx(z-h)/R^5, \tag{1}$$

$$H_y^P=3Cy(z-h)/R^5, \tag{2}$$

$$H_z^P=3C(z-h)^2/R^5-C/R^3, \tag{3}$$

wherein $R=\sqrt{x^2+y^2+(z-h)^2}$ represents a spherical distance between the TX antenna 302 and an RX antenna, and C=I dA/(4π) is a constant that is proportional to a TX antenna moment, 0 is antenna current, and dA is loop antenna area.

Expressions for the secondary fields associated with the presence of the layered earth are more complex since they involve Sommerfeld integrals. In order to differentiate these scattered fields from the scattered fields associated with a buried target, the layered-earth fields are denoted with a superscript E herein:

$$H_x^E=-(C/\delta^3)(x/r)T_1, \quad (4)$$

$$H_y^E=-(C/\delta^3)(y/r)T_1, \quad (5)$$

$$H_z^E=-(C/\delta^3)T_0, \quad (6)$$

wherein $r=\sqrt{x^2+y^2}$ is a cylindrical distance between the TX and the RX antennas. The two Sommerfeld integrals that appear for the vertical TX polarization are:

$$T_0 = \int_0^\infty \overline{R}(g)g^2e^{-gA}J_0(gB)dg, \quad (7)$$

$$T_1 = \int_0^\infty \overline{R}(g)g^2e^{-gA}J_1(gB)dg, \quad (8)$$

wherein $A=(z+h)/\delta$, $B=r/\delta$, and $\delta=\{2/[(\sigma_1+j\in_1\omega)\mu_0\omega]\}^{1/2}$ is the electrical skin depth for the upper layer in the earth $\sigma_1$ is conductivity for the upper layer, $\in_1$ is dielectric permittivity for the upper layer in the earth, j is a square root of −1, ω is angular frequency, and $\mu_0$ is the permeability constant.

Without loss of generality, the RX loop can be situated in the x-z plane (y=0) as shown in FIG. 3. For this arrangement, the combined primary and earth fields ($H^{PE}=H^P+H^E$) can be represented as:

$$H_x^{PE}=3Cx(z-h)/R^5-(C\delta^3)(x/r)T_1, \quad (9)$$

$$H_y^{PE}=0, \quad (10)$$

$$H_z^{PE}=3C(z-h)^2/R^5-C/R^3-(C\delta^3)T_0. \quad (11)$$

Measured magnetic fields at multiple frequencies can be used to find an initial null orientation $\hat{u}_{n0}$ for a reference frequency n. If no target is present, then Equation (10) above shows that the initial measured magnetic field has no y component, and the null orientation $\hat{u}_{n0}=\hat{u}_y$ for the reference frequency (and all other frequencies as well), wherein $\hat{u}_y$ is a unit vector in the y-direction. Non-zero field components in the reference null direction at one or more frequencies are indicative of the presence of a target, i.e., deviations from a plane parallel configuration of one or more layers. Alternatively, back-calculated fields can be used to find magnetic field null directions at some or all transmitted frequencies. According to Equation (10) above $\hat{u}_{n0}=\hat{u}_y=\hat{u}_{n1}=\ldots=\hat{u}_{N-1}$ when no target is present, wherein N denotes the number of frequencies that are employed. Thus, in the absence of a target, a relative direction of the null orientation does not change as a function of transmitted frequency, and a constant null direction as a function of frequency indicates the absence of a target.

Accurate measurement of $H_y$ alone would permit target detection as a non-zero value for $H_y$ indicates the presence of a target. Unfortunately, measurement of a weak y-field component is difficult, and such measurements tend to be obscured by signal contributions associated with the much larger primary transmitted field or the layered earth response. Detection of the associated weak electrical signals from the RX antenna is problematic in view of receiver noise, baseline and gain drift and receiver orientation limitations. Determination of $H_y$ values or null directions based on a sequence of received measurements at three or more orientations permits a single receiver to be used for all measurements so that the effects of receiver drift can be eliminated or compensated. An initial nulling orientation at a reference frequency can be used to null, reduce or eliminate large primary and earth responses while also providing an accurate reference.

Figure 4:
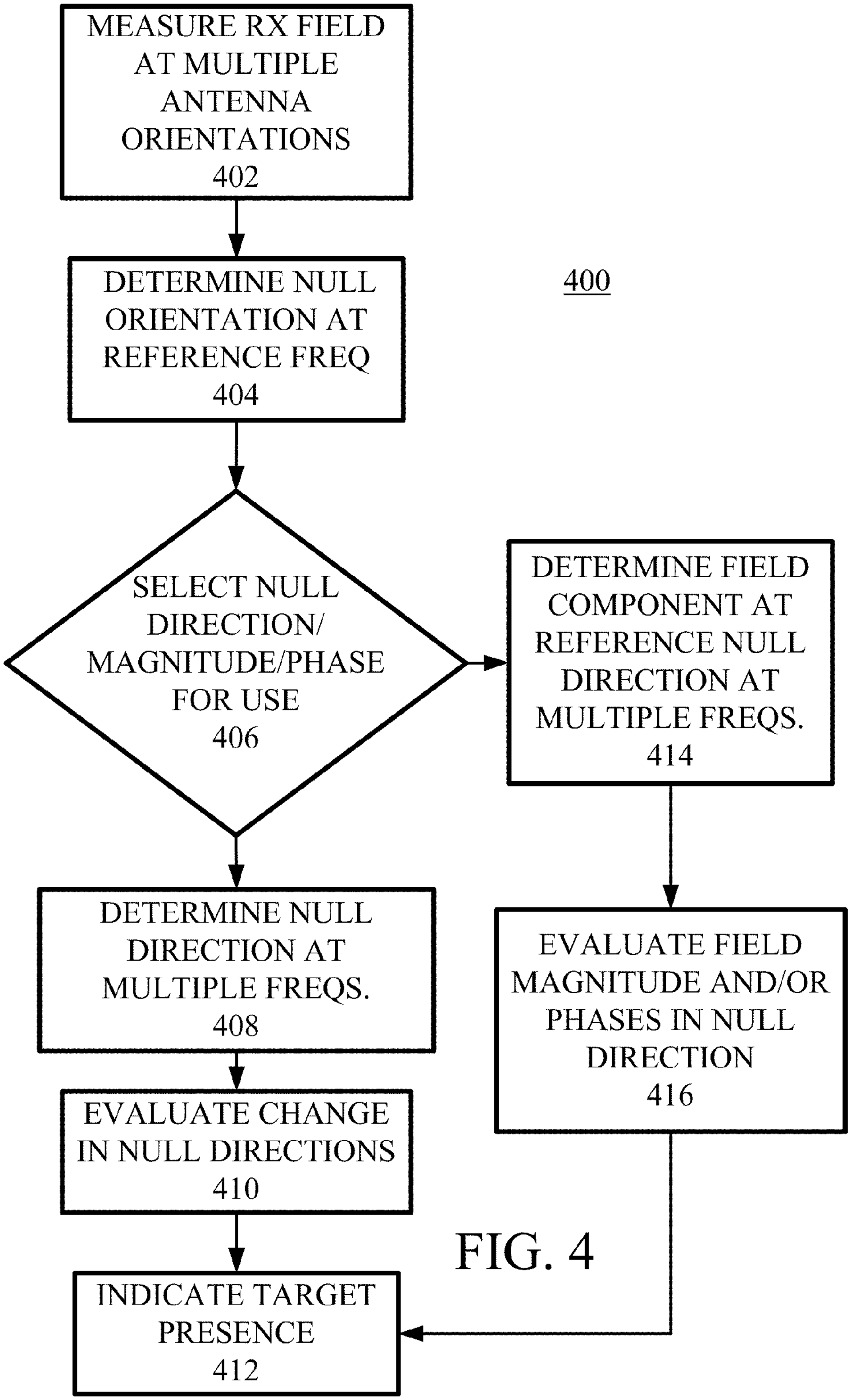
FIG. 4 illustrates representative methods for identifying the presence of a target object based on variations in a field component as a function of frequency or variations in a null direction as a function of frequency.

FIG. 4 illustrates representative target detection methods 400. At 402, measured values of fields detected at an RX antenna in three or more orientations with respect to a vertically transmitted field are obtained at a plurality of frequencies. At 404, a reference null direction for the received field at a single (reference) frequency is determined. At 406, a determination is made as to execute target detection based on variations in null direction or variations in a magnitude of a particular field component such as a y-component or a component in a frequency dependent null direction as described above. At 408, null directions are computed for a plurality of frequencies, and at 410 these null directions are evaluated to determine if the null direction changes or changes appreciably as a function of frequency. If a change in null direction is detected, presence of a target object is signaled or otherwise indicated at 412. Alternatively, at 414, selected component values at a plurality of frequencies are evaluated. Variation in the selected component values can be associated with a target, and target object presence can be signaled at 412. For convenience, a null direction at a reference frequency can be established as a reference null direction, and reference direction component values or variations in null directions determined based on one or more frequencies. Precise identification of a y-axis is unnecessary or other directional axis is unnecessary. Variability of y-component or other selected component (typically, a component in a reference null direction) of the received field as a function of frequency can be used as a basis for indicating target presence.

Back-Calculation of Field Components

Transmitted fields can be detected with a single receiver that is configured so as to rotate about an axis. After measurements at three rotation angles are completed, these measurements can be used to back-calculate the components of received field at one or more or all transmitted frequencies to produce estimated values. Such calculations can be performed with respect to a preferred coordinate system. In some examples, x, y, and z components of the received magnetic field are determined with respect to a beam coordinate system or a global coordinate system. Since the three field measurements can be made with a single receiver, these measurements can be very accurate because time-varying drift and gain errors that are encountered using three separate approximately orthogonal receivers are avoided.

A representative method for calculation of three orthogonal field components at the RX antenna based on three measurements associated with three antenna orientations can be described with reference to FIG. 5. In the processing described below, the measured signals produced at the three RX antenna orientations are referred to as $\tilde{B}_1,\tilde{B}_2,\tilde{B}_3$. As shown in FIG. 4, global (x,y,z) coordinate system having respective x-, y-, and z-axes and a rotated beam coordinate system $(\tilde{x},\tilde{y},\tilde{z})$ can be defined. The $\tilde{z}$-axis of the rotated beam coordinate system corresponds to the axis of rotation of an RX antenna. For convenience in computation, the RX antenna is situated at the origin of the global (x,y,z) coordinate system. Other locations can then be handled via a simple coordinate translation. The $\tilde{z}$ axis is defined as the rotation axis for the receiver. The orientation of this rotation axis is defined by the angles θ and ϕ in a local spherical coordinate system. In FIG. 5, the $\tilde{z}$-axis is shown as relatively close to the y-axis since this is the approximate direction of the null in the absence of a target object. The $\tilde{y}$-axis is arbitrarily defined so as to be parallel to $\hat{u}_{\tilde{z}} \times \hat{u}_z$. The third orthogonal axis ($\tilde{x}$) is defined by a vector cross product of unit vectors so that $\hat{u}_{\tilde{x}} = \hat{u}_{\tilde{y}} \times \hat{u}_{\tilde{z}}$.

A coordinate transformation (rotation) from global coordinates to rotated beam coordinates can be written in matrix form:

$$\begin{bmatrix} \hat{u}_{\tilde{x}} \\ \hat{u}_{\tilde{y}} \\ \hat{u}_{\tilde{z}} \end{bmatrix} = [T] \begin{bmatrix} \hat{u}_x \\ \hat{u}_y \\ \hat{u}_z \end{bmatrix}, \tag{12}$$

wherein a transformation matrix T is defined by $$[T] = \begin{bmatrix} -\cos\phi\cos\theta & -\sin\phi\cos\theta & \sin\theta \\ \sin\phi & -\cos\phi & 0 \\ \cos\phi\sin\theta & \sin\phi\sin\theta & \cos\theta \end{bmatrix}. \tag{13}$$

An inverse coordinate transformation can be written as $$\begin{bmatrix} \hat{u}_x \\ \hat{u}_y \\ \hat{u}_z \end{bmatrix} = [T]^{-1} \begin{bmatrix} \hat{u}_{\tilde{x}} \\ \hat{u}_{\tilde{y}} \\ \hat{u}_{\tilde{z}} \end{bmatrix}, \tag{14}$$

wherein the inverse of the transformation matrix T is:

$$[T]^{-1} = \begin{bmatrix} -\cos\phi\cos\theta & \sin\phi & \cos\phi\sin\theta \\ -\sin\phi\cos\theta & -\cos\phi & \sin\phi\sin\theta \\ \sin\theta & 0 & \cos\theta \end{bmatrix} = [T]^T \tag{15}$$

The transformation matrix T is an orthogonal matrix and the inverse of the transformation matrix T is equal to the matrix transpose.

In the rotated beam coordinate system, the angle between the rotational axis and the receiver antenna is defined as $\tilde{\theta}$ and the rotation angle of the antenna as $\tilde{\phi}$ (see FIG. 5). A unit vector that defines the orientation of the receiver antenna can be expressed in terms of the component vectors $$[\tilde{A}] = \begin{bmatrix} A_{\tilde{x}} \\ A_{\tilde{y}} \\ A_{\tilde{z}} \end{bmatrix} = \begin{bmatrix} \sin\tilde{\theta}\cos\tilde{\phi} \\ \sin\tilde{\theta}\sin\tilde{\phi} \\ \cos\tilde{\theta} \end{bmatrix}. \tag{16}$$

The corresponding orientation in the local coordinate system can then be obtained via the transformation of Equation (14), i.e., $$[A] = \begin{bmatrix} A_x \\ A_y \\ A_z \end{bmatrix} = [T]^{-1}[\tilde{A}] \tag{17}$$

If three rotation angles $\tilde{\phi}_1$, $\tilde{\phi}_2$, and $\tilde{\phi}_3$ are used to obtain the measurement values $\tilde{B}_1, \tilde{B}_2, \tilde{B}_3$, respectively, then the three associated receiver orientations can be expressed in the local coordinate system as $$\begin{aligned} [A_3] &= \begin{bmatrix} A_{x1} & A_{x2} & A_{x3} \\ A_{y1} & A_{y2} & A_{y3} \\ A_{z1} & A_{z2} & A_{z3} \end{bmatrix} \\ &= [T]^{-1}[\tilde{A}_3] \\ &= [T]^{-1} \begin{bmatrix} \sin\tilde{\theta}\cos\tilde{\phi}_1 & \sin\tilde{\theta}\cos\tilde{\phi}_2 & \sin\tilde{\theta}\cos\tilde{\phi}_3 \\ \sin\tilde{\theta}\sin\tilde{\phi}_1 & \sin\tilde{\theta}\sin\tilde{\phi}_2 & \sin\tilde{\theta}\sin\tilde{\phi}_3 \\ \cos\tilde{\theta} & \cos\tilde{\theta} & \cos\tilde{\theta} \end{bmatrix} \end{aligned} \tag{18}$$

Based on the matrix representation for the unit vectors associated with the receiver, the magnetic flux density that is measured by the receiver at these three rotation angles can be expressed as $$[\tilde{B}_1 \tilde{B}_2 \tilde{B}_3] = [B][A_3] = [B_x B_y B_z][A_3] \tag{19}$$

Finally, the back-calculated field values can be represented in terms of the measured field values via $$[B] = [B_x B_y B_z] = [\tilde{B}_1 \tilde{B}_2 \tilde{B}_3][A_3]^{-1} \tag{20}$$

wherein $[A_3]^{-1}$ is the inverse of the matrix of Equation (18). Thus, based on three measured values $\tilde{B}_1$, $\tilde{B}_2$, $\tilde{B}_3$ at three RX antenna orientations, the received magnetic field vector at the RX antenna can be determined.

Estimation of Null Direction

Based on back-calculated x, y, and z-components of the magnetic field using the three measured field values, an orientation that results in a null in the magnetic field can be determined. A complex-valued vector field can be represented in terms of magnitudes and phases as $$B = \hat{u}_x |B_x| e^{j\alpha_x} + \hat{u}_y |B_y| e^{j\alpha_y} + \hat{u}_z |B_z| e^{j\alpha_z}, \tag{21}$$

wherein $\hat{u}_x, \hat{u}_y, \hat{u}_z$ are unit vectors associated with a coordinate system, $B_x, B_y, B_z$ are field amplitudes along the respective unit vector directions, $\alpha_x, \alpha_y, \alpha_z$ are phases associated with each of the field components, and j is a square root of −1. A unit null vector N that is perpendicular to the received field is defined as $$N = \hat{u}_x N_x + \hat{u}_y N_y + \hat{u}_z N_z. \tag{22}$$

By definition, the null vector N is orthogonal to the field B so that B·N=0. Based on this dot product, two real-valued equations can be obtained by taking the real and imaginary parts of the dot product:

$$|B_x| N_x \cos(\alpha_x) + |B_y| N_y \cos(\alpha_y) + |B_z| N_z \cos(\alpha_z) = 0 \tag{23}$$

$$|B_x| N_x \sin(\alpha_x) + |B_y| N_y \sin(\alpha_y) + |B_z| N_z \sin(\alpha_z) = 0. \tag{24}$$

Only two of the three variables in Equation (22) are unique, and $N_y$ can initially be assigned a value of 1 since the null vector is expected to be approximately directed in the y direction for the geometry of FIG. 3. Based on Equations (23)-(24), it can be shown that $$\begin{aligned} N_x &= -\frac{|B_y|\cos(\alpha_y)[\tan(\alpha_y) - \tan(\alpha_z)]}{|B_x|\cos(\alpha_x)[\tan(\alpha_x) - \tan(\alpha_z)]} \\ &= -\frac{|B_y|\sin(\alpha_y - \alpha_z)}{|B_x|\sin(\alpha_x - \alpha_z)} \end{aligned} \tag{25}$$

and

-continued $$N_z = -\frac{|B_y|\cos(\alpha_y)[\tan(\alpha_x) - \tan(\alpha_y)]}{|B_z|\cos(\alpha_z)[\tan(\alpha_x) - \tan(\alpha_z)]} = -\frac{|B_y|\sin(\alpha_x - \alpha_y)}{|B_z|\sin(\alpha_x - \alpha_z)}. \tag{26}$$

The desired unit vector in the direction of this null is then defined by $$\hat{u}_N = \frac{N}{|N|} \tag{27}$$

Although $N_y=1$ in this analysis since the null is anticipated to be approximately y-directed, similar analyses can be executed based on assignments such as $N_x=1$ or $N_z=1$. For example, for $N_x=1$, it can be shown that $$N_y = -\frac{|B_x|\sin(\alpha_z - \alpha_x)}{|B_y|\sin(\alpha_z - \alpha_y)} \tag{28}$$

$$N_z = -\frac{|B_x|\sin(\alpha_x - \alpha_y)}{|B_z|\sin(\alpha_z - \alpha_y)}. \tag{29}$$

Although back-calculation to obtain received magnetic field components in a global coordinate system (x,y,z) prior to finding the null field directions can permit simpler interpretation of results, nulling procedures and calculations can be performed without such calculation and other coordinate systems used. For example, calculations in a rotated beam coordinate system $(\tilde{x},\tilde{y},\tilde{z})$ can be used to simplify nulling calculations. It can be easier to interpret results in the global coordinate system but it may be preferable to carry out the nulling procedure in the rotated-beam coordinate system in system implementations. Using the $\tilde{x},\tilde{y},\tilde{z}$ coordinate system, $$[\tilde{B}_x \;\; \tilde{B}_y \;\; \tilde{B}_z] = [\tilde{B}_1 \;\; \tilde{B}_2 \;\; \tilde{B}_3] \begin{bmatrix} \sin\tilde{\theta}\cos\tilde{\phi}_1 & \sin\tilde{\theta}\cos\tilde{\phi}_2 & \sin\tilde{\theta}\cos\tilde{\phi}_3 \\ \sin\tilde{\theta}\sin\tilde{\phi}_1 & \sin\tilde{\theta}\sin\tilde{\phi}_2 & \sin\tilde{\theta}\sin\tilde{\phi}_3 \\ \cos\tilde{\theta} & \cos\tilde{\theta} & \cos\tilde{\theta} \end{bmatrix}^{-1} \tag{30}$$

Establishing a Polarization Ellipse

After measurements at three rotation angles and back-calculation of the three orthogonal field components in either the global or rotated beam coordinate system (or some other coordinate system) at multiple frequencies, then major and minor axes of the three-dimensional (3-D) polarization ellipse can be determined. Measured ellipticity (a ratio of a minor axis to a major axis of a polarization ellipse) can be used for comparison with other measurement techniques. In addition, information about the polarization ellipse can also be used to confirm measurement validity and to determine layered earth resistivities. Since a null vector is in a direction that is orthogonal to a polarization ellipse, if a field is linearly polarized (i.e., the minor axis of the ellipse is zero), then such null angles will not be uniquely defined. Therefore, the measured ellipticity provides a metric for whether or not the measured angles are valid.

When a horizontal separation between the TX antenna and the RX antenna is large enough, or the frequency is high enough, to provide substantial wave tilt, then the null vector directions for these angles will be well defined. On the other hand, when the TX and RX antennas are close together, or the frequency is low, so the wave tilt and ellipticity are small, then the disclosed methods can still be applied to detect targets provided that care is taken. When no targets are present then the ellipticity will be very small, which tells the operator that the non-unique null angles can be ignored. However, if a target is present, then this will increase the ellipticity, thereby leading to unique null directions that can be employed to image the target. In addition, as shown in FIG. 1A, a second TX antenna can be provided to produce a field component that is both out of phase with and not parallel to the field produced by the first antenna. Detection of these two field components permits determination of a unique null direction even without propagation based wave tilt.

When the transmitter dipole is not vertical with respect to the surrounding earth surface, and when there is substantial frequency-dependent wave tilt, false targets can be detected. The surface topography around the survey site, however, can be completely known with sufficient accuracy, either by using available topographic contour maps or by performing a leveling survey. This topography can then be accounted for when data is modeled, thereby eliminating or reducing false target detection.

Example Numerical Simulations

Additional features and benefits of the disclosed methods and apparatus can be described with reference to a numerical simulation of system use. Such simulations can use magnetic field data produced by electromagnetic modeling programs such as EMIGMA, available from http://www.petroseikon-.com/emigma/. In a first simulation example, a stationary vertical TX loop antenna and an RX loop antenna that is movable along an x-axis as defined in the above examples is used.

Fixed TX/RX Antennas

In one example, a large, deeply-buried (500 m deep) resistive body is set as a target. A vertical (z-directed) transmitting loop antenna with a moment of 1 A-m$^2$ is located at x=−1000 m, y=0 m, and z=1 m, and a transmitted field frequency is stepped in decade steps between 0.1 Hz and 1000 Hz. Note that these values are for purposes of illustration only, and results can be scaled to larger transmitters based on transmitter moment. In this example, a survey is carried out along the x-axis, wherein $-4000$ m$<x<$4000 m, y=0 m, and z=1 m. The resistive target is assumed to be a rectangular prism with dimensions of 1 km by 1 km by 100 m high, wherein an offset of the target from a survey line is 500 m, i.e., the top/center point of the target is located at x=0 m, y=−500 m, z=−500 m. Note that this target orientation places the survey line over the edge of the target. Earth resistivity is assigned a value ρ=100 Ωm and earth relative permittivity is assigned a value $\epsilon_r=10$. The target is assigned a higher resistivity but the same dielectric permittivity (ρ=100 Ωm and $\epsilon_r=10$).

Calculated magnitudes and phases for the three components of the magnetic flux density at a receive loop are shown in FIGS. 6A-6C and FIGS. 7A-7C, respectively. It is apparent from FIGS. 6A-7C that the desired target response, i.e., $|B_y|$, is orders of magnitude smaller than the other two field components. Recall that this field component would be zero in the absence of a target (see Equation (10) above). The large vertical component $|B_z|$ is the result of a large primary field (note that the peak occurs at the transmit loop location) and the small target response cannot be seen in this component of the field. Likewise, $|B_x|$ represents the tilt in the primary field that occurs as the field interacts with the earth, and once again the target is not apparent in this large field component. Furthermore, the target cannot be detected in the phase plots for either the x or z components of the field. Therefore, a precise measurement of the magnitude and/or phase of $B_y$ is required to detect the target. Note that by having two relatively large components of the magnetic field (i.e., $|B_x|$ and $|B_z|$) that are out of phase with each other, a polarization ellipse is established in which a desired null vector is orthogonal to the plane of the polarization ellipse. Therefore, the null orientation is well defined.

Figure 6B:
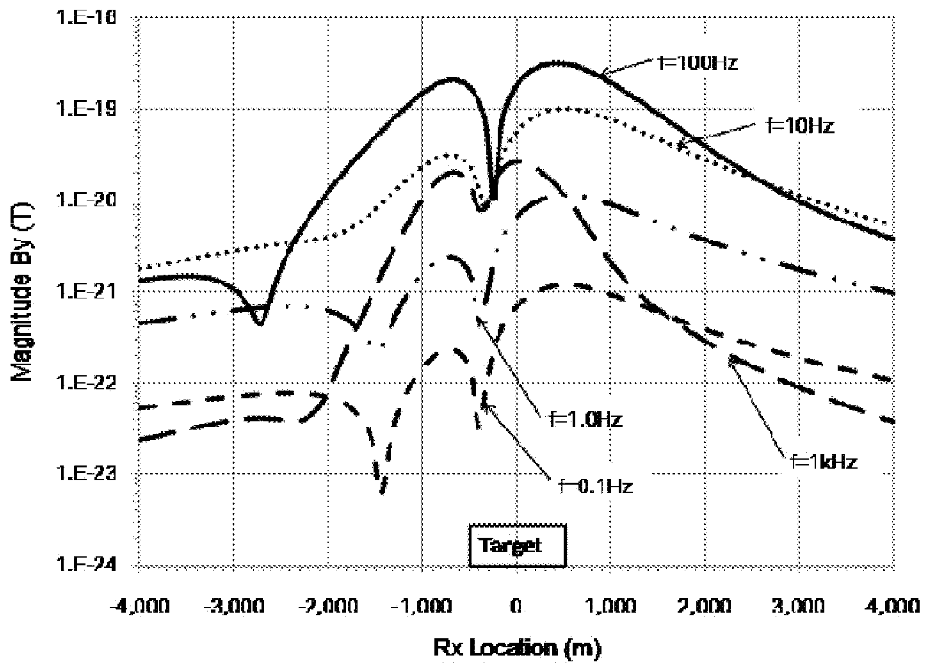
Figure 6C:
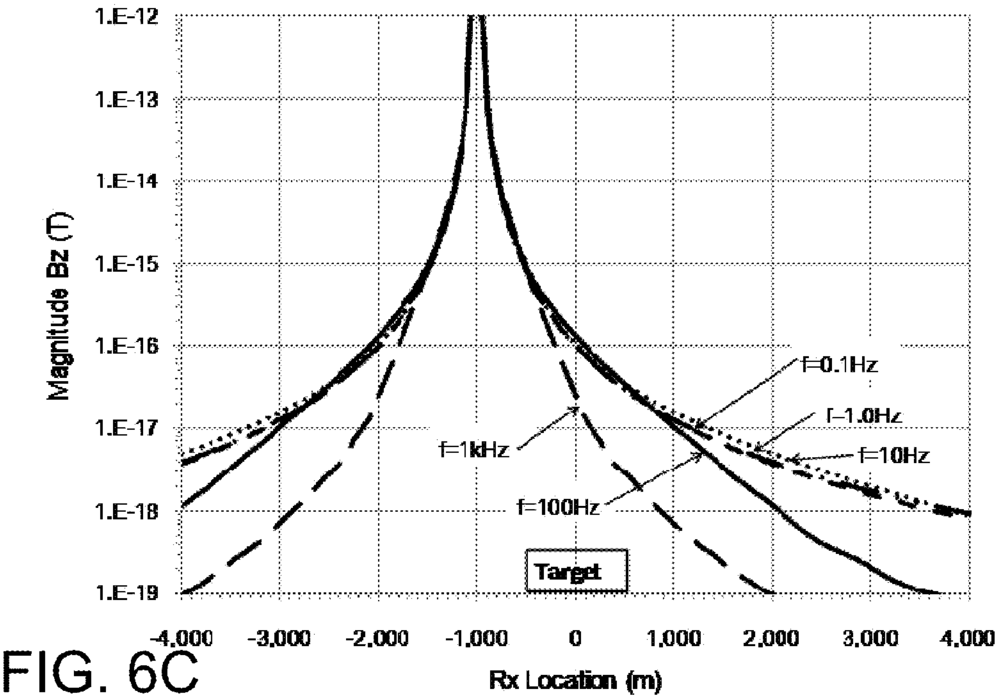
Figure 7A:
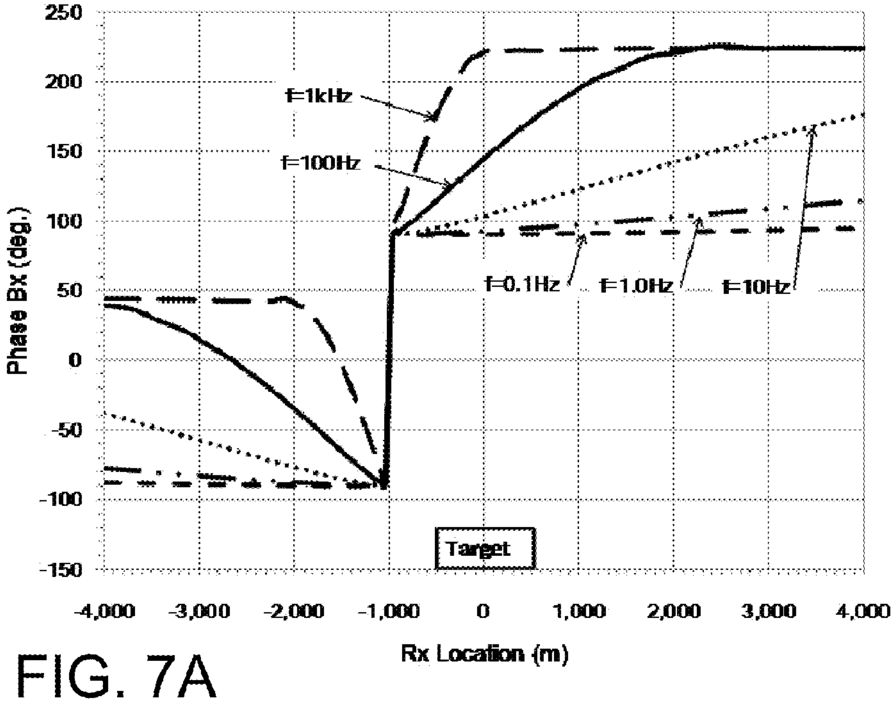
FIGS. 7A-7C are graphs of computed phases of the components of magnetic flux density corresponding to the magnitudes of FIGS. 6A-6C, respectively.
Figure 7B:
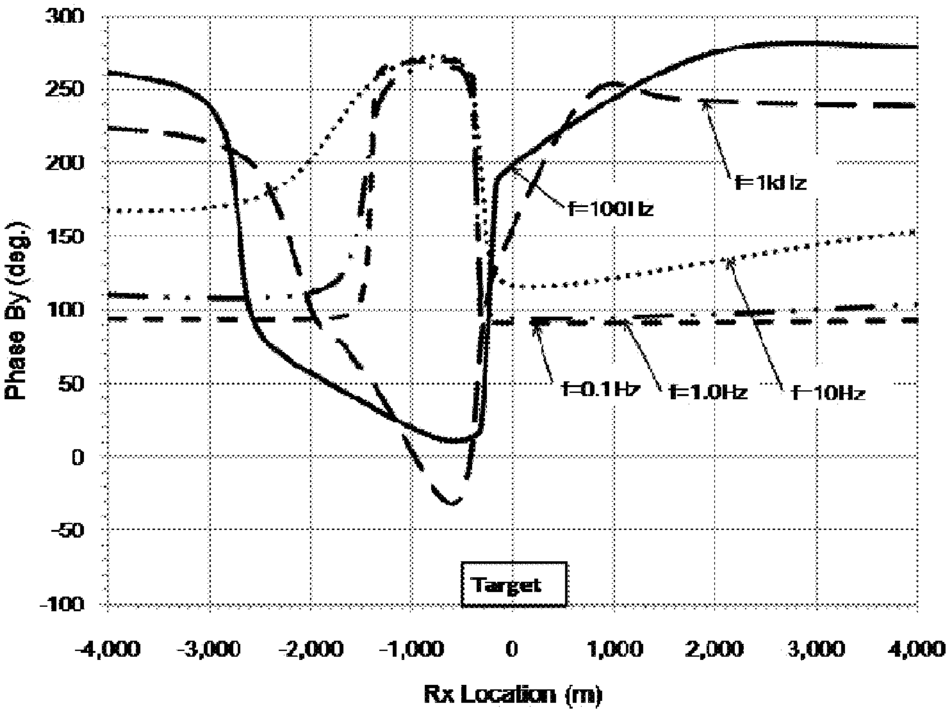
Figure 7C:
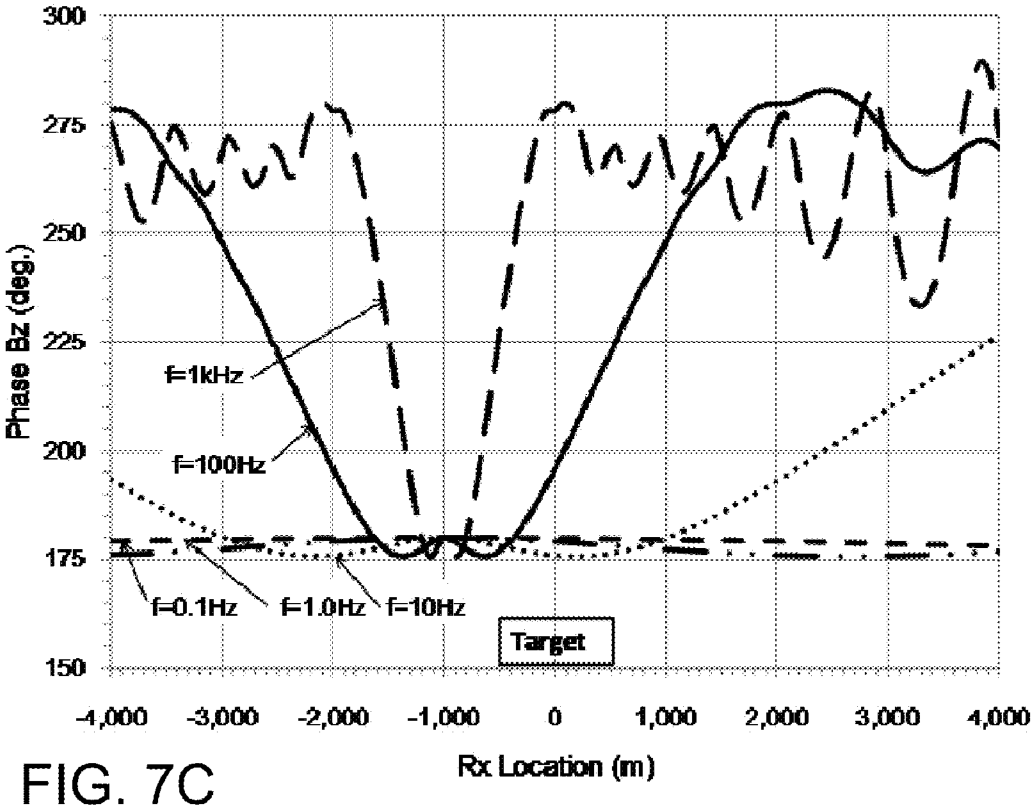

FIG. 6B shows that the y-component of the target's magnitude response is very small at survey points prior to the target location (RX antenna locations for x less than about −2 km), but once the target is approached the response becomes much larger. The magnitude response then slowly dies off at survey points beyond the target. This decay is fairly slow since the target lies between the transmitter and the receiver for these cases. Furthermore, the phase of $B_y$ (FIG. 7B) can also be used to detect the target as it changes substantially as the RX antenna approaches the target.

As noted previously, if it is possible to measure $B_y$ without measuring any of the large $B_x$ or $B_z$, fields, then it would be simple to locate a buried target. Unfortunately, since $B_y$ is so much smaller than $B_x$ and $B_z$, any misalignment in a y-oriented RX loop responds in part to the much larger $B_x$ or $B_z$ fields, thereby swamping the desired response based on the weak $B_y$. Thus, detection of deeply buried targets such as resistive bodies with a single receiver is difficult if there is even a small misalignment with respect to a y-direction. Such misalignments are almost inevitable in practical systems. However, measurements at multiple antenna orientations and determination of a reference null direction permit target detection even in the presence of y-axis misalignments. Simulated multiple antenna orientation based measurement are provided below.

At each survey point the RX loop is rotated about an axis to three positions (at precisely measured angles) to obtain measured values $[\tilde{B}_1\ \tilde{B}_2\ \tilde{B}_3]$ at a plurality of frequencies. Back-calculated fields are calculated based on Equation (20) to obtain orthogonal components of the field $[B]=[B_x\ B_y\ B_z]$. The calculated field values can then be used with Equations (25)-(27) to obtain unit null vectors at multiple frequencies.

Figure 8:
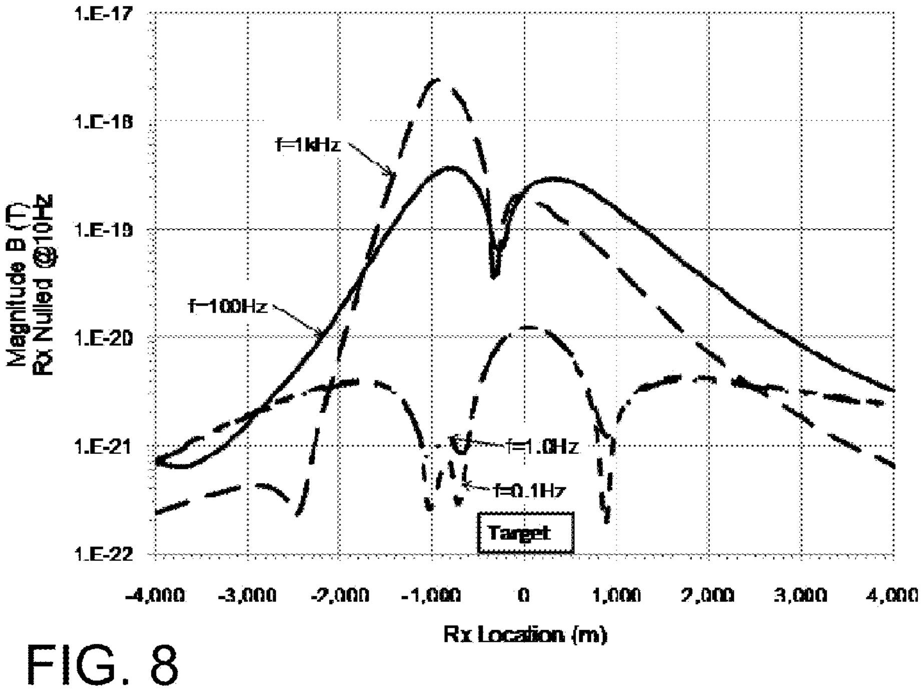
FIG. 8 is a graph of computed magnitude of a received magnetic field component at the RX antenna as a function of RX antenna location at 0.1 Hz, 1.0 Hz, 100 Hz, and 1 kHz in a null direction based on a 10 Hz reference frequency, and corresponding to FIGS. 6A-7C.

In a first method, the magnetic field is measured in a reference null orientation defined at a reference frequency at other frequencies. Simulated magnitude results are shown in FIG. 8 for the case of a 10 Hz reference frequency. Large responses are obtained at f=100 Hz and f=1000 Hz measurement frequencies, where both of these responses exhibit nulls near a front edge of the target. FIG. 8 also shows that much smaller responses are obtained at the lower measurement frequencies of f=0.1 Hz and f=1 Hz. This indicates that the target response at these low frequencies is more similar to the f=10 Hz reference frequency than it is for the higher measurement frequencies. This is likely due to the skin depth in the earth being much larger than the target depth at these two frequencies.

Figure 9:
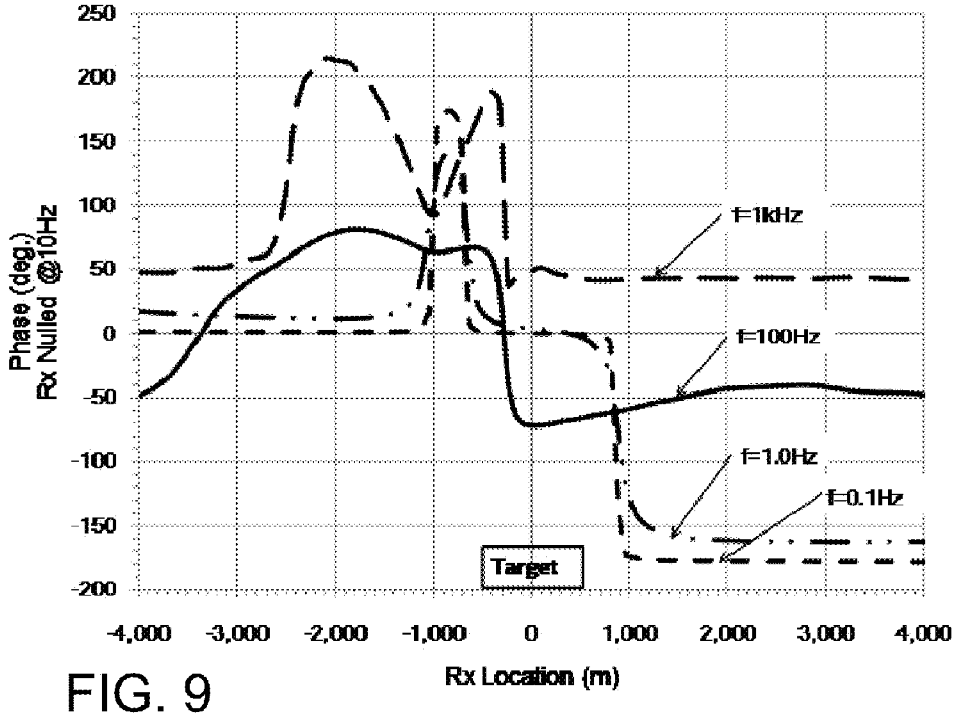
FIG. 9 is a graph of computed phase of received magnetic field at the RX antenna as a function of RX antenna location at 0.1 Hz, 1.0 Hz, 100 Hz, and 1 kHz corresponding to the field magnitudes of FIG. 8.

FIG. 9 illustrates phase responses corresponding to FIG. 8. These phase responses can be used in conjunction with magnitude response to locate or characterize a buried target.

Figure 10:
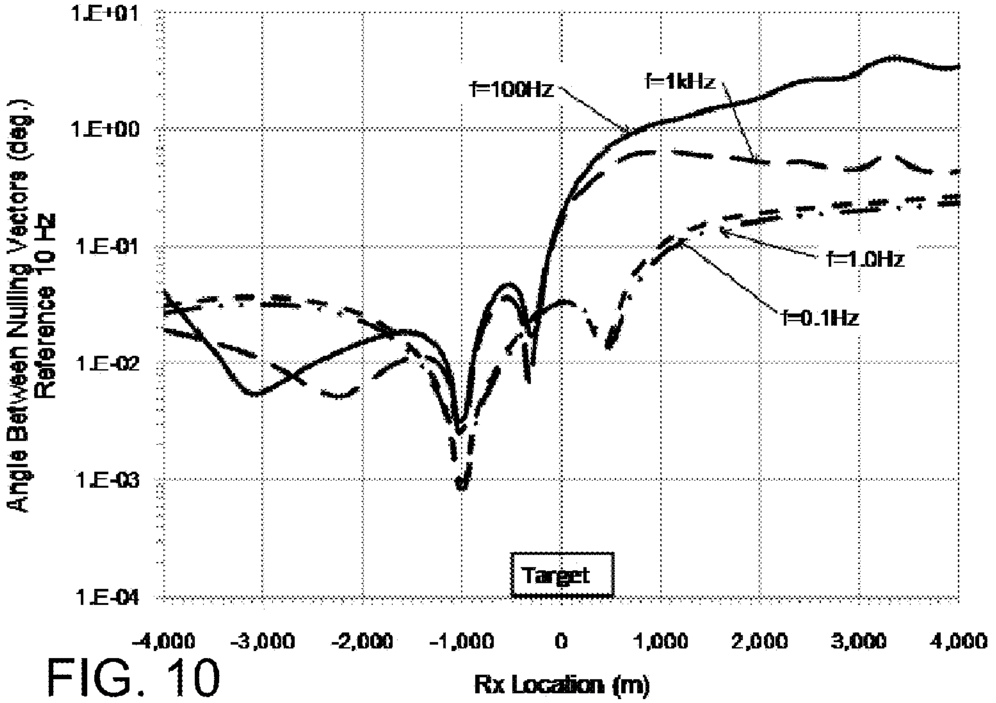
FIG. 10 is a graph of an angle between a reference null vector computed at a 10 Hz reference frequency and null vectors at 0.1 Hz, 1.0 Hz, 100 Hz, and 1 kHz as a function of RX antenna location.

In a second approach, null vectors at some or all frequencies are compared with a reference null vector at the reference frequency. The results for this method are shown in FIG. 10 in which angular differences between null directions at 0.1 Hz, 1 Hz, 100 Hz, and 1 kHz and the reference null direction at the 10 Hz reference frequency are shown as a function of RX antenna location.

Example Measurements

Variable RX/TX Antenna Separation

Figure 11:
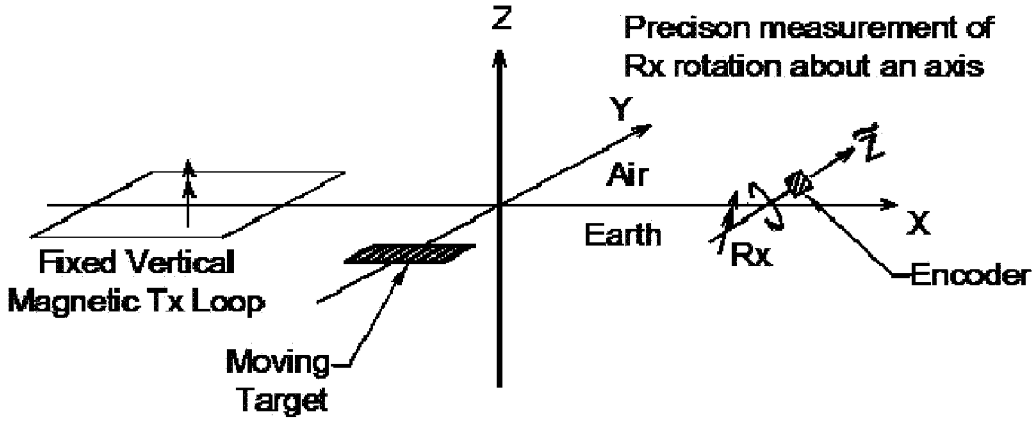
FIG. 11 illustrates RX/TX geometry for a fixed vertical magnetic TX loop and a rotatable RX loop. For convenience in testing, a target was moved at a fixed RX/TX loop separation.

FIG. 11 illustrates a representative layout of a system 1100 used to detect a small aluminum sheet target. The system 1100 includes a fixed vertical magnetic TX loop, an RX loop fixed to a rotary encoder which can provide precise rotational angles, and a movable target. In order to demonstrate certain characteristics of the disclosed methods and systems, TX and RX antenna locations are fixed and the target was moved to acquire data. This approach produces fields that are equivalent to moving the TX antenna with respect to the RX antenna. For an initial test, transmitter loop dimensions were 30 m by 30 m, transmitter-receiver range was 30 m, and target dimensions were 60 cm by 75 cm. This target was selected to represent a scaled target for targets of interest in practical applications.

Figure 12:
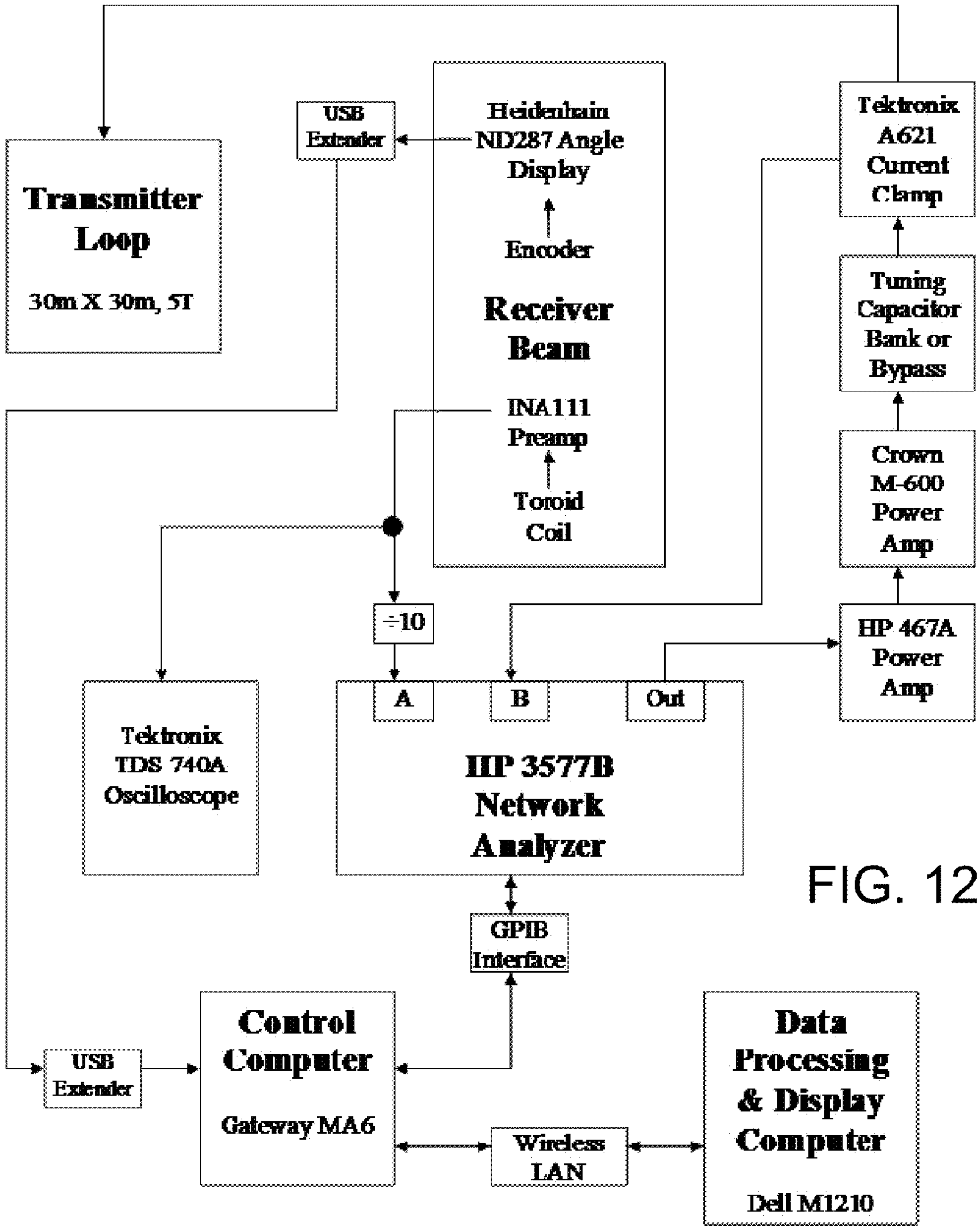
FIG. 12 is a schematic block diagram of a representative measurement system based on a network analyzer.

With reference to FIG. 12, a representative measurement system is based on a laboratory network analyzer (such as a Hewlett Packard 3577B) as a transmitter, receiver, and data-acquisition system, along with hard-wired cables from the network analyzer (which can be located remotely in, for example, a trailer) to the rotatable loop antenna that can be situated about 30 meters from the network analyzer. Similar components can be used in full-scale field systems.

In initial demonstrations, an aluminum sheet target was translated along the y-axis at the same x-location as the receiver loop, and the field at the receiver detected and stored. Measured responses can be compared with predicted responses calculated using the EMIGMA modeling program or other appropriate computer modeling software. Pulling the target with fixed transmitter and receiver antennas is equivalent to a scenario with a fixed target and a moving TX antenna and/or RX antenna, and the data are displayed in this manner in the accompanying graphs.

Figure 13:
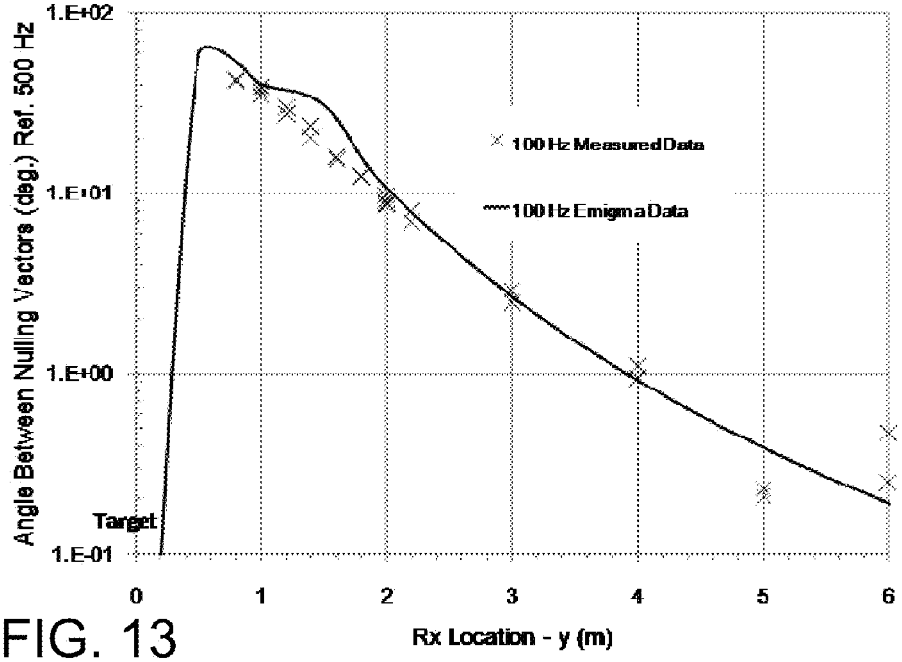
FIG. 13 is a graph of an angle between a reference null vector computed at a 500 Hz reference frequency and computed and measured null vectors at z with a target situated to have no x-offset.

FIG. 13 shows an angle between the null vectors for a 100 Hz transmitter frequency relative to a reference frequency (500 Hz in this example) as a function of RX antenna location. These results show a typical response associated with a target. If there were no target present, then there would be no detectable change in null vector direction. It can be noted that there is excellent agreement between the measured data and the theoretically calculated EMIGMA data, except for increasing noise as y gets larger, i.e., the target moves farther away from the RX loop. As shown in FIG. 13, the effect of the target is apparent to at least y=4 m.

Figure 14:
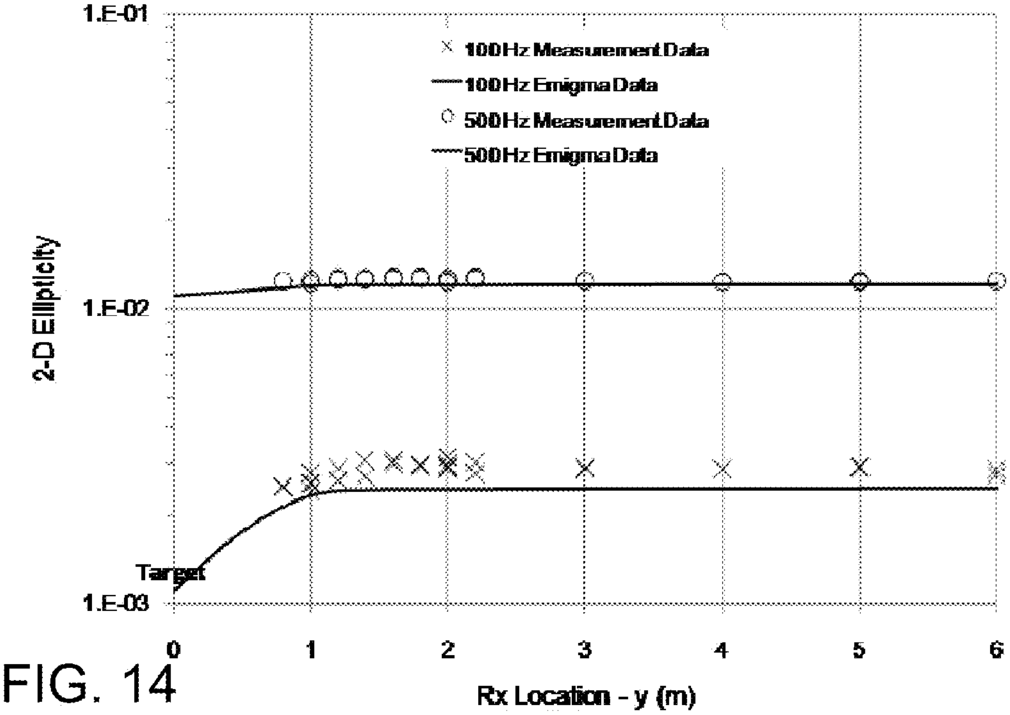
FIG. 14 is a graph of computed and measured 2-D ellipticity as a function of RX antenna location at frequencies of 100 Hz and 500 Hz with no target x-offset.
Figure 15:
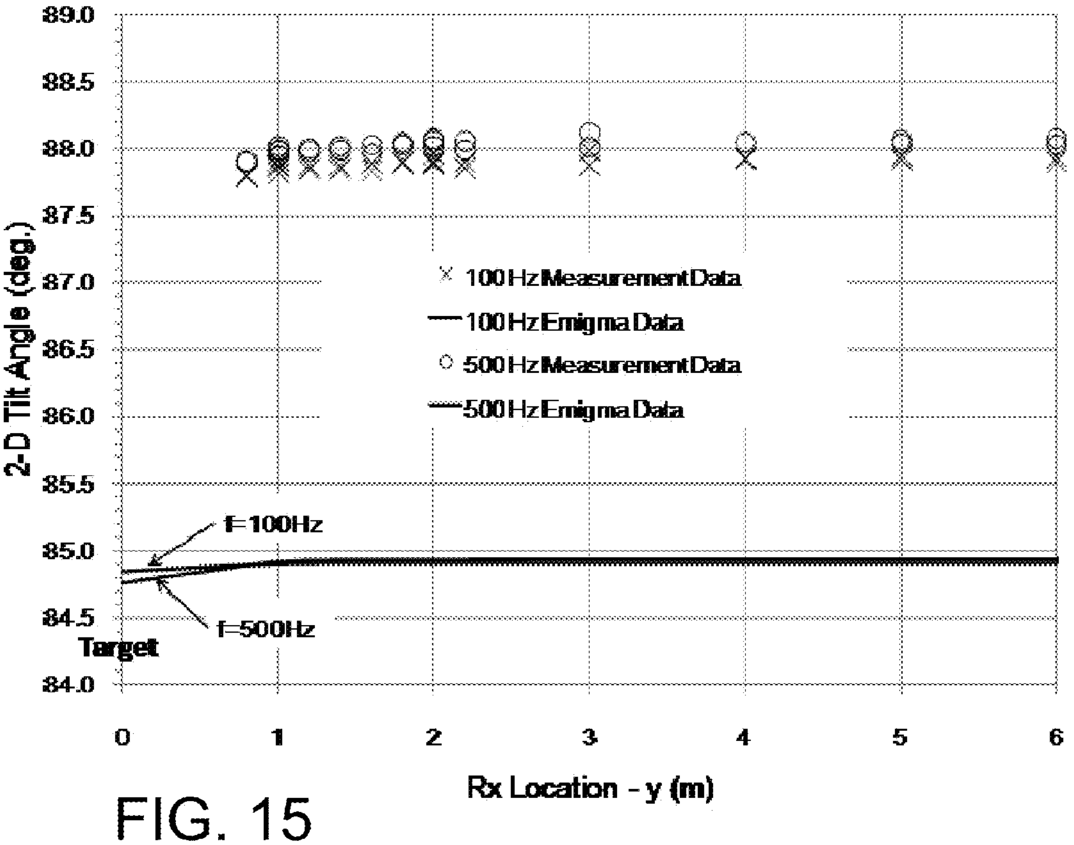
FIG. 15 is a graph of computed and measured ellipticity tilt angle as a function of RX antenna location at frequencies of 100 Hz and 500 Hz with no target x-offset.

FIGS. 14-15 show data collected with this measuring system in a form that is often used in conventional EM systems. FIG. 14 is a plot of field ellipticity defined as a ratio of minor to major axes of the field polarization ellipse in the x-z plane. The effect of the target can be seen reliably out to about 1 m with this technique. FIG. 15 shows the tilt angle of the polarization ellipse, another commonly used parameter in conventional EM surveys. There is a large offset between the measured and theoretical data due to the misalignment of the TX and RX antennas. The target is reliably detected out to only approximately 1 m even with this precisely aligned measurement system. However, in practical field measurements in which the RX antenna is moved, it is generally impractical to accurately align the measuring instrument relative to a global coordinate system. Any misalignment would lead to a variable tilt angle offset at each RX antenna location, so that conventional tilt angle measurements have limited use. The differential systems disclosed herein do not have such limitations, since the orientation of the measurements is determined by a measured reference angle associated with a reference null direction at a reference frequency, and precise alignment of the RX beam axis is not required.

As previously discussed, there must be a large enough horizontal distance between the TX and the RX antennas to provide two moderately large components of the magnetic field that are out of phase in order to provide a polarization ellipse. The plane for this polarization ellipse then provides a reference for finding unique DTAC angles. Note that if the horizontal spacing between the TX and RX is too small to provide a polarization ellipse that leads to unique angles for the nulls, then it is possible to create such an ellipse by a second x-directed TX that is fed out of phase relative to a z-directed TX.

Moving Transmitter/Receiver Arrays

Figure 16:
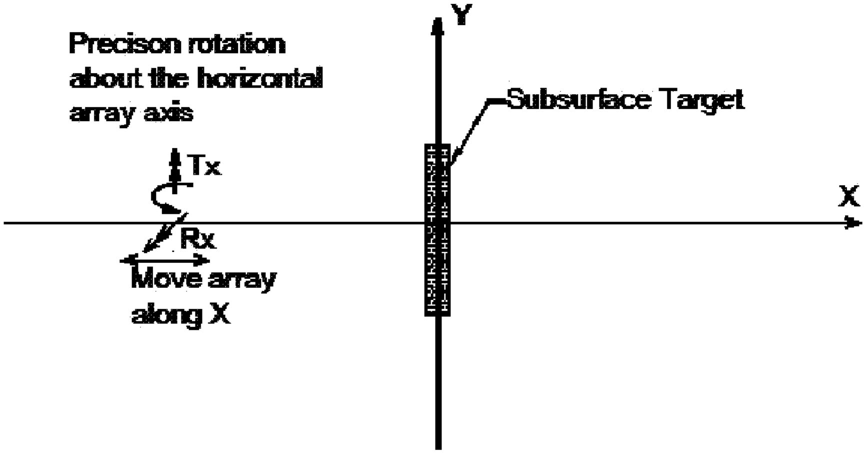
FIG. 16 illustrates measurement geometry for a moving TX/RX array which rotates about an axis parallel to a y-axis and in which the TX/RX array is translated along an x-axis.

A high-moment, fixed TX antenna can be used to image deeply buried targets. However, it is also possible to employ the disclosed methods with a moving array in which both the TX and RX antennas are rigidly attached to a rotating beam, as shown in FIG. 16. For the results shown below, both the TX moment and the rotation axis for the TX/RX array are both oriented in the y-direction and the array is then moved along a profile line along the x-axis. The RX coil is tipped slightly from the horizontal array axis (e.g., 10°). The combined TX/RX array is then rotated, typically to three precise angles, and measurements of detected field are stored. Measurements at multiple angles can be made at a particular frequency and a new frequency selected for measurement, or measurements at multiple frequencies can be made at a single orientation, and then a new orientation selected for measurement. Regardless of how obtained, the measured data permits determination of a null direction and field component in a null direction, wherein the null direction and null directed field component is frequency dependent in the presence of a target.

Figure 17:
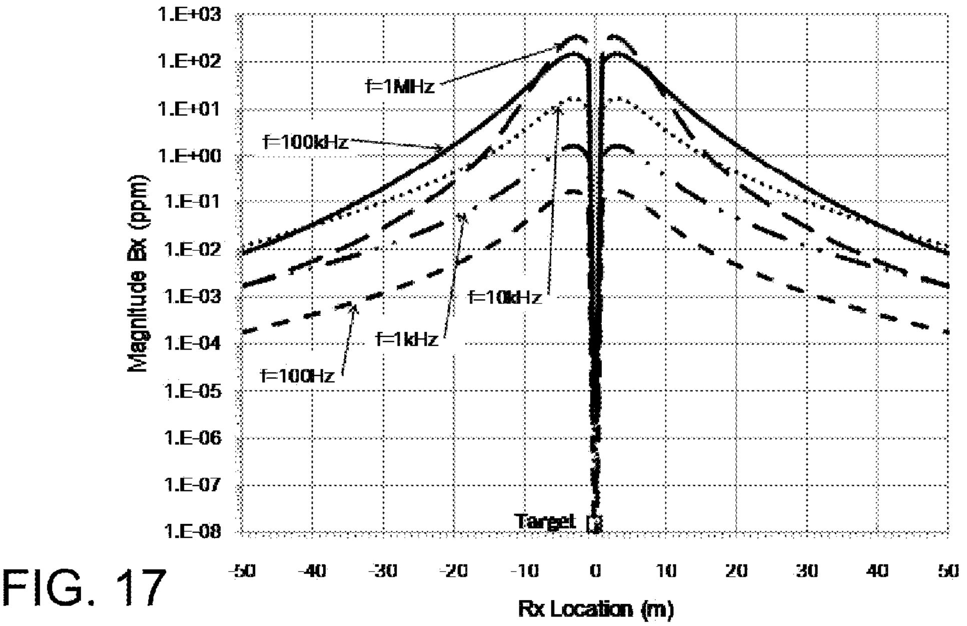
Figure 18:
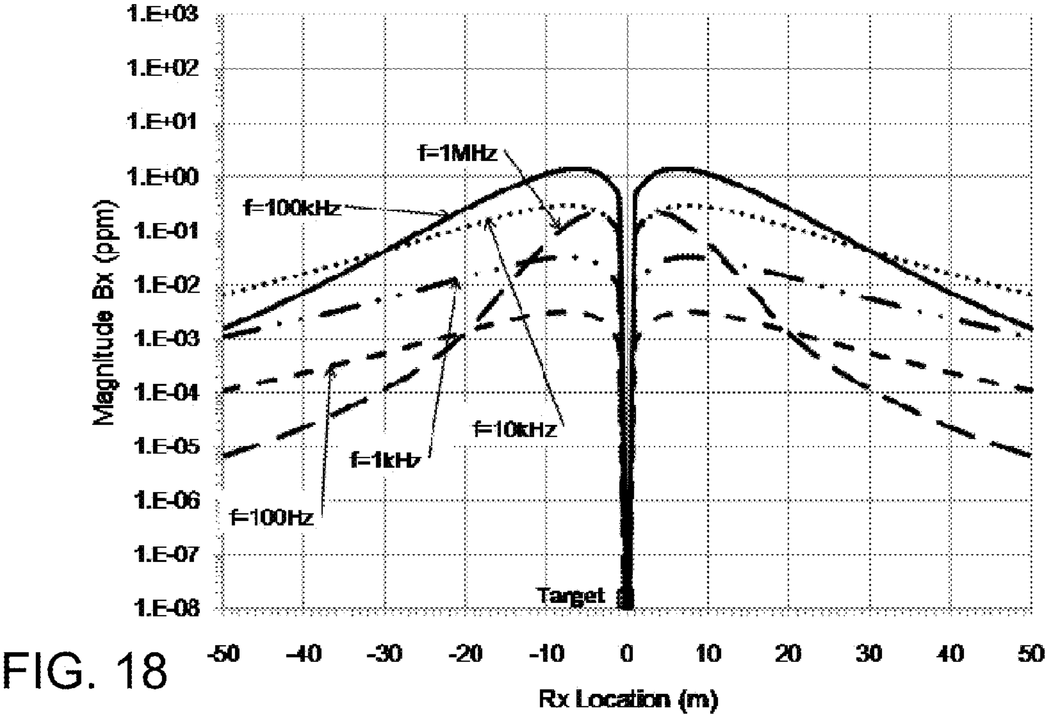
Figure 21:
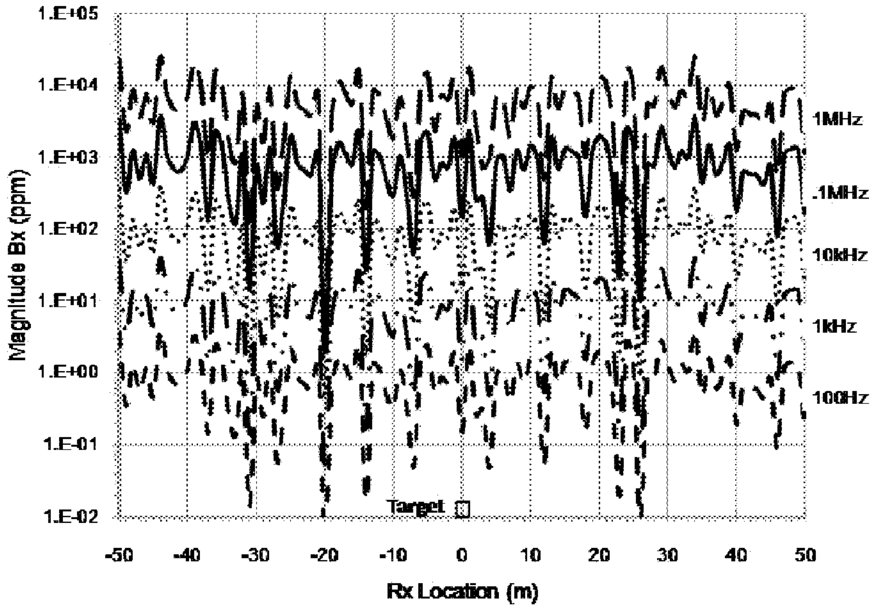
FIG. 21 is a graph of an x-component of magnetic flux density for a random 0.1 degree misalignment of the RX antenna in the x-z plane with the void target and antenna configuration of FIGS. 17-20. Transmitted frequencies are 100 Hz, 1 kHz, 10 kHz, 100 kHz, and 1 MHz.

FIGS. 17 through 19 show results associated with such a TX/RX DTAC array to image void targets at depth of 3 m, 10 m, and 30 m, respectively. For each of FIGS. 17-19, the long target was a void with a 2 m by 2 m cross-sectional area. FIG. 17 shows that a void at a depth (to the top of the target) of 3 m produces signal anomalies of one to one-hundred parts per million (ppm). If it were possible to precisely orient the RX so that only the x-component of the field is measured, then it would be possible to measure these targets using conventional methods. Unfortunately, any misalignment in the RX antenna produces substantial pickup of the much larger primary $B_y$ field component or the large, frequency-dependent $B_z$ field component that is shown in FIG. 20. However, the deleterious effects of the RX antenna misalignment errors can be mitigated using the disclosed techniques as further demonstrated below. Similar results for target depths of 10 m and 30 m are shown in FIG. 18 and FIG. 19, respectively Problems associated with misalignments are illustrated in FIG. 21 that shows the calculated dependence of a measured $B_x$ field component on random RX antenna misalignments with a standard deviation of 0.1 degrees in the x-z plane as a function of TX/RX antenna array location on a profile line. For convenience, misalignment in the x-y plane was not modeled because the TX and RX antennas are assumed to be rigidly attached to each other, so that the primary field at the RX antenna is constant for all locations along the profile. In typical operational surveys, the misalignment of the beam to an earth with varying topography could be orders of magnitude larger than the 0.1 degree misalignments used to obtain FIG. 21. Even with such small misalignment errors, a void cannot be detected with conventional methods.

Figure 22:
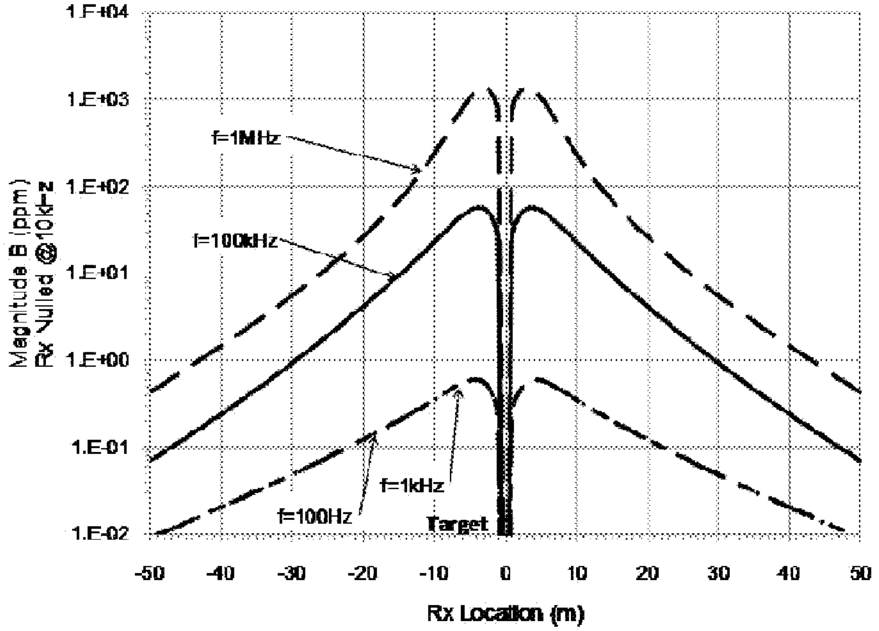
FIG. 22 is a graph of a measured magnitude response in a reference null direction at a 10 kHz reference frequency at transmitted frequencies of 100 Hz, 1 kHz, 100 kHz, and 1 MHz for the void target and the RX/TX antenna configuration of FIGS. 17-20.
Figure 23:
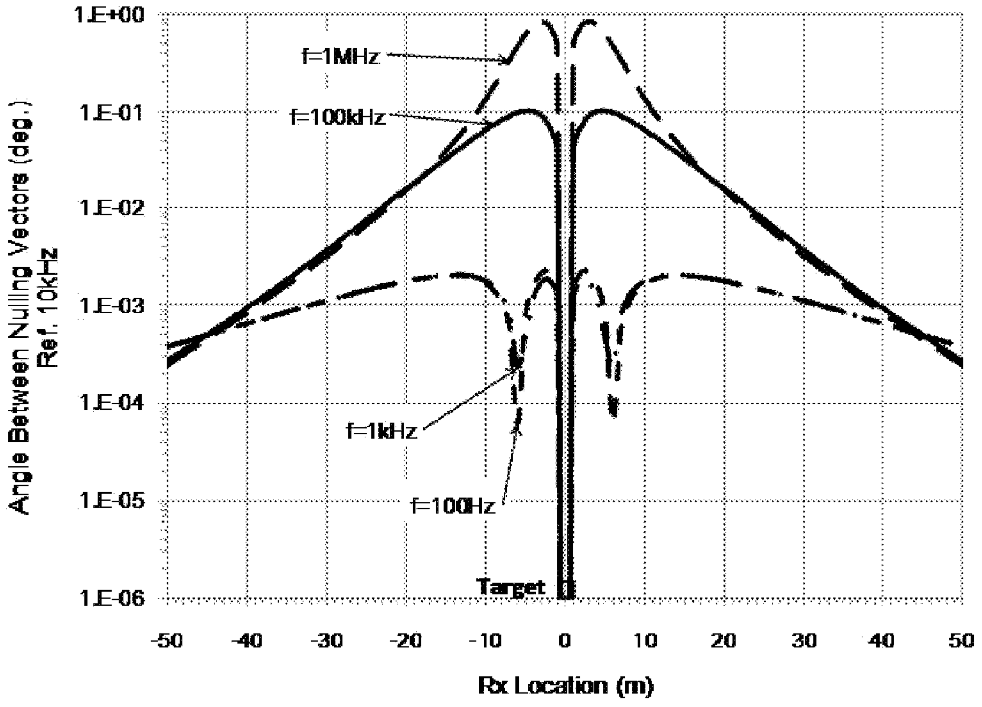
FIG. 23 is a graph of an angle between null vectors based on measured fields at transmitted frequencies of 100 Hz, 1 kHz, 100 kHz, and 1 MHz and a reference null vector at a 10 kHz reference frequency for the void target and the RX/TX antenna configuration of FIGS. 17-20.

Use of a reference frequency to establish array geometry, and then measuring at a series of additional frequencies permits successful measurement even in the presence of misalignment errors as shown in FIGS. 22-23. FIG. 22 shows that a magnitude of a field in a reference null direction established based on a null vector at a reference frequency is suitable for target detection. Alternatively, as shown in FIG. 23, variation in null vector direction as indicated by, for example, angular differences between null vectors at a one or more frequencies and a reference null vector at a reference frequency permits target identification and location. FIGS. 22-23 are based on a 10 kHz reference frequency and additional transmitted frequencies of 100 Hz, 1 kHz, 100 kHz, and 1 MHz for the void target and the RX/TX antenna configuration of FIGS. 17-20.

Computing Environment

Figure 24:
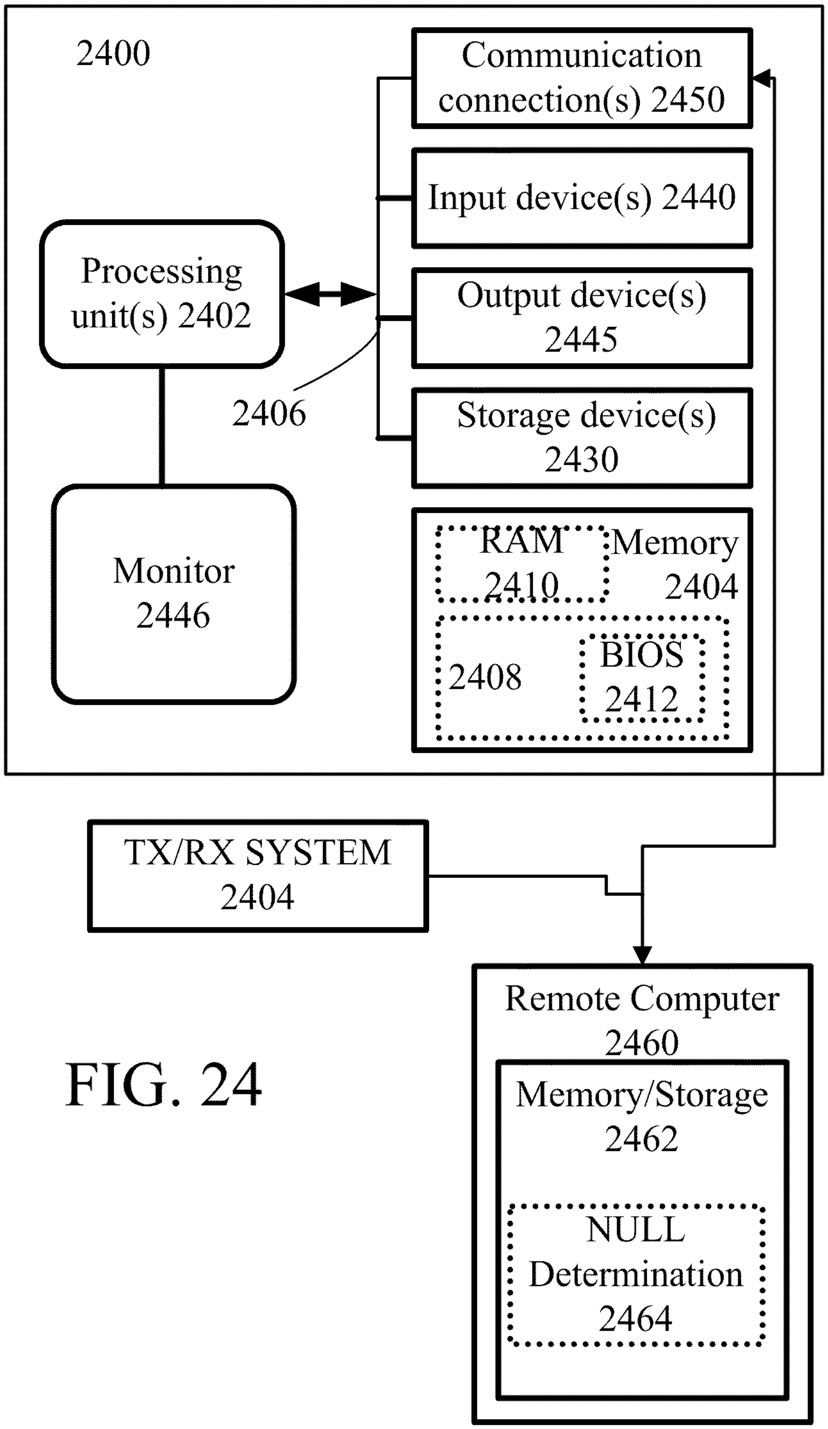
FIG. 24 is a block diagram of a representative computer environment suitable for the disclosed methods and apparatus.

FIG. 24 and the following discussion are intended to provide a brief, general description of an exemplary computing environment in which the disclosed technology may be implemented. Although not required, the disclosed technology is described in the general context of computer-executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand-held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 24, an exemplary system for implementing the disclosed technology includes a general purpose computing device in the form of an exemplary conventional PC 2400, including one or more processing units 2402, a system memory 2404, and a system bus 2406 that couples various system components including the system memory 2404 to the one or more processing units 2402. The system bus 2406 may be any of several types of bus structures including a memory bus or memory controller, a peripheral bus, and a local bus using any of a variety of bus architectures. The exemplary system memory 2404 includes read only memory (ROM) 2408 and random access memory (RAM) 2410. A basic input/output system (BIOS) 2412, containing the basic routines that help with the transfer of information between elements within the PC 2400, is stored in ROM 2408.

The exemplary PC 2400 further includes one or more storage devices 2430 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 2406 by a hard disk drive interface, a magnetic disk drive interface, and an optical drive interface, respectively. The drives and their associated computer-readable media provide nonvolatile storage of computer-readable instructions, data structures, program modules, and other data for the PC 2400. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 2430 including an operating system, one or more application programs, other program modules, and program data. A user may enter commands and information into the PC 2400 through one or more input devices 2440 such as a keyboard and a pointing device such as a mouse. Other input devices may include a digital camera, microphone, joystick, game pad, satellite dish, scanner, or the like. These and other input devices are often connected to the one or more processing units 2402 through a serial port interface that is coupled to the system bus 2406, but may be connected by other interfaces such as a parallel port, game port, or universal serial bus (USB). A monitor 2446 or other type of display device is also connected to the system bus 2406 via an interface, such as a video adapter. Other peripheral output devices, such as speakers and printers (not shown), may be included.

The PC 2400 may operate in a networked environment using logical connections to one or more remote computers, such as a remote computer 2460. In some examples, one or more network or communication connections 2450 are included. As shown in FIG. 24, the communication connections 2450 and the remote computer are coupled to a TX/RX system that produces and receives fields used for target location and identification. The remote computer 2460 may be another PC, a server, a router, a network PC, or a peer device or other common network node, and typically includes many or all of the elements described above relative to the PC 2400, although only a memory storage device 2462 has been illustrated in FIG. 24. The personal computer 2400 and/or the remote computer 2460 can be connected to a logical a local area network (LAN) and a wide area network (WAN). Such networking environments are commonplace in offices, enterprise-wide computer networks, intranets, and the Internet. As shown in FIG. 24, the storage device 2662 is configured to store computer-executable instructions for null direction calculation, back-calculations of fields, and other calculations as well as to provide location information or identification of possible target locations in a memory portion 2462. In other examples, such computer-executable instructions are provided in a memory device or other storage at the PC 2400 or distribution over a network.

When used in a LAN networking environment, the PC 2400 is connected to the LAN through a network interface. When used in a WAN networking environment, the PC 2400 typically includes a modem or other means for establishing communications over the WAN, such as the Internet. In a networked environment, program modules depicted relative to the personal computer 2400, or portions thereof, may be stored in the remote memory storage device or other locations on the LAN or WAN. The network connections shown are exemplary, and other means of establishing a communications link between the computers may be used.

In view of the many possible embodiments to which the principles of the disclosed technology may be applied, it should be recognized that the illustrated embodiments are only preferred examples and should not be taken as limiting scope. We therefore claim all that comes within the scope and spirit of the appended claims.

We claim:

1. A method, comprising:

receiving a transmitted electromagnetic field at a receiver antenna;

recording values associated with the field received at the receiver antenna for a plurality of receiver antenna orientations and a plurality of received frequencies;

determining a reference null direction at a reference frequency selected from the plurality of frequencies based on the recorded values associated with the field received at the receiver antenna; and based on a field variation in the reference null direction or a variation of the null direction at one or more of the plurality frequencies, indicating a target presence.

2. The method of claim 1, wherein the plurality of receiver antenna orientations includes at least three orientations.

3. The method of claim 2, further comprising receiving the transmitted electromagnetic field at a plurality of receiver antennas and recording values associated with the field received at the plurality of receiver antennas for a plurality of receiver antenna orientations and a plurality of received frequencies, wherein the recorded values associated with the three orientations are obtained with corresponding receiver antennas of the plurality of receiver antennas.

4. The method of claim 3, further comprising rotating the corresponding receiver antennas to establish the plurality of orientations.

5. The method of claim 1, further comprising rotating the receiver antenna to establish the plurality of orientations.

6. The method of claim 1, further wherein the target presence is established based on a variation in a null direction at one or more frequencies with respect to the reference null field direction at the reference frequency.

7. The method of claim 1, further comprising providing an estimate of a target location based on the variation in null direction at one or more frequencies associated with a plurality of receiver antenna and transmitter antenna separations, spatial positions, or antenna dimensions.

8. The method of claim 1, further comprising providing an estimate of a target location based on the field variation in the reference null direction at one or more frequencies associated with a plurality of receiver antenna and transmitter antenna separations, spatial positions, or antenna dimensions.

9. A method, comprising:

determining frequency dependent changes in a null vector orientation in a received electromagnetic field; and based on the frequency dependent changes in the null vector orientation, indicating a presence of a target.

10. The method of claim 9, further comprising receiving electromagnetic field measurements associated with at least three receiver antenna orientations, and determining orthogonal electromagnetic received field components based on the electromagnetic field measurements.

11. The method of claim 1, wherein the transmitted field received at the receiver antenna includes out of phase and non-parallel field contributions produced with a first antenna and a second antenna.

12. A method, comprising:

receiving a null direction associated with a reference frequency; and based on magnitudes and/or phases of a field detected by a receiver antenna at a plurality of frequencies in a direction based on the reference null direction, indicating a presence of a target.

13. The method of claim 12, further comprising receiving received field values at a receiver antenna and associated with at least three receiver antenna orientations; and determining magnitudes and/or phases of the detected field in the reference null direction based on the detected field values.

14. An apparatus, comprising:

at least one receiver antenna that detects a transmitted field at a plurality of frequencies and received at a receiver antenna location at a plurality of angular orientations with respect to a transmitted field; and a processing system that determines a reference null direction based on the detected field, and, based on the reference null direction, indicate whether a target is likely to be present.

15. The apparatus of claim 14, further comprising a rotation stage coupled to the receiver antenna and that establishes the plurality of receiver antenna orientations.

16. The apparatus of claim 15, wherein the receiver antenna and a transmitter antenna are retained at a fixed separation.

17. The apparatus of claim 15, wherein a separation between the receiver antenna and a transmitter antenna is variable.

18. The apparatus of claim 14, wherein the processing system estimates field components in the reference null direction for the plurality of frequencies, and provide an indication of target presence based on the estimates.

19. The apparatus of claim 14, wherein the processing system estimates null directions for the plurality of frequencies, and provides an indication of target presence based on the estimated null directions.

20. The apparatus of claim 14, further comprising a transmitter that transmits a first field and a second field that is out of phase with the first field and such that the first field and the second field are not aligned at the receiver antenna, wherein the reference null direction is determined by the processing system based on the first field and the second field.

21. The apparatus of claim 14, wherein the processing system determines an ellipticity of the field detected by the receiver antenna, and based on a magnitude of the determined ellipticity, indicate that a target is not present.

22. The method of claim 1, wherein the transmitted electromagnetic field received at the receiver antenna is associated with an electromagnetic induction field in the earth.

23. The method of claim 1, wherein the reference null direction is determined based on a Fourier transform of associated recorded values.

24. The method of claim 1, further comprising determining frequency dependent changes in a null vector orientation in the received field, wherein the reference null direction is determined based on the frequency dependent changes in the null vector orientation.

25. The method of claim 1, further comprising determining a target depth, size, location, or electrical property based on the field variation in the reference null direction or the variation of the null direction at one or more of the plurality frequencies.

* * * * *